(12) United States Patent
Baillargeon et al.

(10) Patent No.: US 6,636,544 B2
(45) Date of Patent: Oct. 21, 2003

(54) OVERLAPPING WAVELENGTH-TUNABLE VERTICAL CAVITY SURFACE-EMITTING LASER (VCSEL) ARRAYS

(75) Inventors: James N. Baillargeon, Springfield, NJ (US); Wen-Yen Hwang, Sugar Land, TX (US); Klaus Alexander Anselm, Sugar Land, TX (US); Jun Zheng, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 09/951,299

(22) Filed: Sep. 11, 2001

(65) Prior Publication Data

US 2002/0101904 A1 Aug. 1, 2002

Related U.S. Application Data

(60) Provisional application No. 60/251,629, filed on Dec. 6, 2000, and provisional application No. 60/251,631, filed on Dec. 6, 2000.

(51) Int. Cl.[7] .............................. H01S 5/026; H01S 5/42
(52) U.S. Cl. ............................................. 372/50; 372/97
(58) Field of Search ....................................... 372/50, 23

(56) References Cited

U.S. PATENT DOCUMENTS

| | | | |
|---|---|---|---|
| 5,031,187 A | 7/1991 | Orenstein et al. ............... 372/50 |
| 5,206,871 A | 4/1993 | Deppe et al. .................. 372/45 |
| 5,301,201 A | * 4/1994 | Dutta et al. .................... 372/43 |
| 5,493,577 A | 2/1996 | Choquette et al. ............. 372/46 |
| 5,574,738 A | * 11/1996 | Morgan ......................... 372/28 |
| 5,624,791 A | 4/1997 | Kawabata et al. ............. 430/25 |
| 5,677,924 A | 10/1997 | Bestwick ...................... 372/96 |
| 5,699,375 A | * 12/1997 | Paoli ............................ 372/50 |
| 5,835,517 A | * 11/1998 | Jayaraman et al. ........... 372/50 |
| 5,898,722 A | 4/1999 | Ramdani et al. .............. 372/50 |
| 5,902,702 A | 5/1999 | Nakao et al. .................. 430/5 |
| 5,963,568 A | * 10/1999 | Paoli ............................ 372/23 |
| 5,978,401 A | 11/1999 | Morgan |
| 5,991,326 A | * 11/1999 | Yuen et al. .................... 372/96 |
| 6,117,699 A | 9/2000 | Lemoff et al. ................ 438/35 |
| 6,148,016 A | 11/2000 | Hegblom et al. ............. 372/50 |
| 6,195,485 B1 | * 2/2001 | Coldren et al. ............... 385/49 |
| 6,215,804 B1 | * 4/2001 | Sahlen et al. ................. 372/50 |
| 6,445,495 B1 | * 9/2002 | Walker et al. ............... 359/344 |

FOREIGN PATENT DOCUMENTS

JP  09-36495  2/1997

OTHER PUBLICATIONS

Sugihwo et al., "25 nm Wavelength Range Tunable Vertical Cavity Lasers," Solid State Electronic Laboratory, CIS–X 328, Stanford University, Jun. 1997, pp. 108–109.

Karim et al., "1.55–$\mu$m Vertical–Cavity Laser Arrays for Wavelength–Division Multiplexing," *IEEE Journal on Selected Topics in Quantum Electronics*, vol. 7, No. 2, (2001), pp. 178–183.

* cited by examiner

*Primary Examiner*—Paul Ip
*Assistant Examiner*—Jeffrey Zahn
(74) *Attorney, Agent, or Firm*—N. Stephan Kinsella; Randall C. Furlong

(57) ABSTRACT

A device is provided, the device comprising a first vertical cavity surface-emitting laser (VCSEL) of a monolithic vertical cavity surface-emitting laser (VCSEL) array, the first vertical cavity surface-emitting laser (VCSEL) being tunable to a first plurality of wavelengths. The device also comprises a second vertical cavity surface-emitting laser (VCSEL) of the monolithic vertical cavity surface-emitting laser (VCSEL) array, the second vertical cavity surface-emitting laser (VCSEL) being tunable to a second plurality of wavelengths, wherein at least one wavelength is in both the first plurality of wavelengths and the second plurality of wavelengths.

20 Claims, 14 Drawing Sheets

OVERLAPPING WAVELENGTH-TUNABLE VERTICAL CAVITY SURFACE-EMITTING LASER (VCSEL) ARRAYS

CROSS REFERENCES TO RELATED APPLICATIONS

This nonprovisional U.S. national application, filed under 35 U.S.C. §111(a), claims, under 37 C.F.R. §1.78(a)(3), the benefit of the filing date of provisional U.S. national application No. 60/251,629, filed on Dec. 6, 2000 under 35 U.S.C. §111(b), and the benefit of the filing date of provisional U.S. national application No. 60/251,631, filed on Dec. 6, 2000 under 35 U.S.C. §111(b), the entireties of each of which are incorporated herein by reference without disclaimer.

BACKGROUND OF THE INVENTION

1. Field of the Invention

This invention relates generally to laser manufacturing and, more particularly, to vertical cavity surface-emitting lasers (VCSELs).

2. Description of the Related Art

In many applications, it is desirable to have lasers capable of producing light at several different wavelengths that are closely spaced. In particular, for optical communication applications, such as wavelength division multiplexing (WDM), many wavelengths spaced a few nanometers apart are useful. There are several possible ways to make wavelength-selectable arrays with edge-emitting semiconductor lasers. However, edge-emitting semiconductor lasers that meet specifications for telecommunication applications are typically complex and expensive to manufacture. Monolithic edge-emitting semiconductor laser arrays with large numbers of wavelengths are impractical technically and economically.

Vertical cavity surface-emitting lasers (VCSELs) provide a more cost effective solution for many applications. Vertical cavity surface-emitting lasers (VCSELs) can be made using wafer-scale processing and testing, dramatically lowering the cost in comparison to edge-emitting semiconductor lasers, for example. In a vertical cavity surface-emitting laser (VCSEL), the wavelength may be determined by the optical cavity length. The optical cavity length is the effective distance between the two generally parallel mirrors, typically distributed Bragg reflectors (DBRs), enclosing the active region of the vertical cavity surface-emitting laser (VCSEL). Since the optical cavity length is typically set by the epitaxial growth, which should be uniform across the entire wafer or workpiece, the wavelength is uniform.

Tunable vertical cavity surface-emitting lasers (VCSELs) are desired in order to provide different wavelengths on the same wafer or workpiece. One conventional approach to providing tunable vertical cavity surface-emitting lasers (VCSELs) uses a top mirror that is suspended on a micromachined cantilever. With this conventional structure, any given vertical cavity surface-emitting laser (VCSEL) can be tuned to any wavelength within the tuning range. However, this conventional approach involves a micromachined structure that is difficult to fabricate, has reliability problems and is susceptible to mechanical vibrations. A more reliable way of providing monolithically integrated vertical cavity surface-emitting laser (VCSEL) arrays is still needed.

In a vertical cavity surface-emitting laser (VCSEL), the lasing wavelength may be determined by the length of a Fabry-Perot cavity formed by two distributed Bragg reflectors (DBRs) separated by the semiconductor optical cavity active region that includes layers with optical gain. The optical gain in a vertical cavity surface-emitting laser (VCSEL) is typically provided by quantum wells. Each quantum well has a gain spectrum with a single peak wavelength, and some spectral width over which gain is present. Each distributed Bragg reflector (DBR) is composed of quarter-wave layers of alternating high and low refractive indices. The distributed Bragg reflector (DBR) reflectivity is characterized by a complex amplitude and phase spectrum. The amplitude spectrum exhibits a high reflectivity region at the center of which the reflectivity is highest. The width of the high reflectivity region is referred to as the distributed Bragg reflector (DBR) stop-band width. The phase characteristic of the distributed Bragg reflector (DBR) varies approximately linearly over the stop-band width. The lasing wavelength of a vertical cavity surface-emitting laser (VCSEL) is determined by the optical length of the semiconductor cavity and the phase characteristics of the distributed Bragg reflectors (DBRs). The gain provided by the active layer, necessary to achieve lasing (threshold gain) is determined by the roundtrip cavity loss that includes material absorption and the distributed Bragg reflector (DBR) transmission. A monolithic multiple-wavelength vertical cavity surface-emitting laser (VCSEL) array requires side-by-side fabrication of vertical cavity surface-emitting lasers (VCSELs) with varying lasing wavelengths, but otherwise uniform laser characteristics, such as threshold gain and current, and efficiency. This implies that the vertical structure of the lasers must vary from device to device on the same wafer, while the cavity losses, material gain, and the distributed Bragg reflector (DBR) transmission remain largely unchanged. The lasing wavelength variation is most commonly realized by changing the optical length of the semiconductor cavity.

One conventional method of making a monolithic multiple wavelength vertical cavity surface-emitting laser (VCSEL) array uses non-uniform growth due to a thermal gradient. The backside of a substrate is patterned prior to epitaxial growth in a molecular beam epitaxy (MBE) reactor. The resulting backside pattern produces a thermal gradient on the surface of the substrate when the wafer is heated. Because growth rate is temperature dependent, there is a variable material thickness and, hence, a variable laser wavelength along the thermal gradient. One disadvantage of this conventional approach is the fact that the arrays are limited to linear geometries. To date, it has been difficult to control the wavelengths precisely and repeatedly over large areas of the wafer.

Another conventional method is to grow a partial vertical cavity surface-emitting laser (VCSEL) structure including the lower distributed Bragg reflector (DBR), the active region, and some part of the upper distributed Bragg reflector (DBR). The wafer is masked and anodically oxidized to some controlled oxide thickness over the exposed portions. A selective etch is then used to remove the oxide. This process is repeated to create different effective cavity lengths for each laser in an array. The remainder of the vertical cavity surface-emitting laser (VCSEL) structure is regrown over the patterned wafer. However, each selective etch is sensitive to voltage and concentration variations that may affect the depth, resulting in reduced control over wavelength spacing between devices in the array.

Yet another conventional method of making a monolithic multiple wavelength vertical cavity surface-emitting laser (VCSEL) array is described, for example, in U.S. Pat. No. 6,117,699 to Lemoff et al. ("the Lemoff et al. '699 patent"), describing an array of N-wavelength vertical cavity surface-emitting lasers (VCSELs) that can be grown with wavelength control. First, as shown in FIG. 1, a foundation vertical cavity surface-emitting laser (VCSEL) structure 100 is grown on a gallium arsenide (GaAs) substrate 105. The foundation vertical cavity surface-emitting laser (VCSEL) structure 100 includes a lower distributed Bragg reflector (DBR) 110 in an optical cavity 145. The lower distributed Bragg reflector (DBR) 110 includes M pairs of layers 115, 120, 125, 130, 135 and 140 (M=6, in FIG. 1), each member of each pair having an index of refraction differing from the other member of each pair. For example, the lower member 115a of the pair 115 may comprise aluminum arsenide (AlAs) and the upper member 115b of the pair 115 may comprise aluminum gallium arsenide ($Al_xGa_{1-x}As$, where $0.15 < x < 1$).

The optical cavity 145 also includes a first intrinsic (non-doped) layer 150, an optical gain layer 155 and a second intrinsic (non-doped) layer 160. The optical cavity 145 also includes N-paired semiconductor phase shift epitaxially grown layers 165, 170, 175 and 180 (N=4 in FIG. 1) of aluminum gallium arsenic (AlGaAs) and indium gallium phosphorus (InGaP), where N is the desired number of different wavelengths.

Next, a region of one of the N-paired semiconductor phase shift layers is lithographically patterned (masked and etched). For example, as shown in FIG. 1, a mask 185 is formed and portions 190 and 195 (shown in phantom) of the paired semiconductor phase shift epitaxially grown layer 180 are removed by selective etching. The steps of patterning (masking and etching) are repeated for a total of at least (N−1)/2 patterning (masking and etching) steps until regions of at least N−1 of the N-paired semiconductor phase shift layers are etched. For example, as shown in FIG. 2, a mask 200 is formed and portions 205 and 210 (shown in phantom) of the paired semiconductor phase shift epitaxially grown layers 170, 175 and 180 are removed by selective etching, forming 4 different effective optical cavity lengths corresponding to 4 different lasing wavelengths.

Finally, an upper vertical cavity surface-emitting laser (VCSEL) structure (not shown) is grown. The upper vertical cavity surface-emitting laser (VCSEL) structure may include an upper distributed Bragg reflector (DBR) similar to the lower distributed Bragg reflector (DBR) 110, but typically having fewer than M pairs of layers, each member of each pair having an index of refraction differing from the other member of each pair. The upper distributed Bragg reflector (DBR) typically has fewer than M pairs of layers so that the reflectivity of the upper distributed Bragg reflector (DBR) is less than the reflectivity of the lower distributed Bragg reflector (DBR) 110. Equivalently, the transmissivity of the upper distributed Bragg reflector (DBR) is greater than the transmissivity of the lower distributed Bragg reflector (DBR) 110. Consequently, more laser photons are emitted from the upper surface (not shown) of the vertical cavity surface-emitting laser (VCSEL) than into the substrate 105.

However, this Lemoff et al. '699 patent method necessarily requires at least (N−1)/2 masking steps, to produce an array of N-wavelength vertical cavity surface-emitting lasers (VCSELs). For a large number N of wavelengths, such methods may become expensive, unwieldy, impractical, and inefficient and may suffer from a loss of yield.

For example, as shown in FIG. 3, a foundation vertical cavity surface-emitting laser (VCSEL) structure 300 is grown on the gallium arsenide (GaAs) substrate 105. The foundation vertical cavity surface-emitting laser (VCSEL) structure 300 includes the lower distributed Bragg reflector (DBR) 110 and an optical cavity 345. The optical cavity 345 includes the first intrinsic (non-doped) layer 150, the optical gain layer 155 and the second intrinsic (non-doped) layer 160. The optical cavity 345 also includes N-paired semiconductor phase shift epitaxially grown layers 165, 170, 175, 180, 365, 370, 375 and 380 (N=8 in FIG. 3) of aluminum gallium arsenic (AlGaAs) and indium gallium phosphorus (InGaP), where N is the desired number of different wavelengths.

Next, a region of one of the N-paired semiconductor phase shift layers is lithographically patterned (masked and etched). For example, as shown in FIG. 3, a mask 305 is formed and portions 390 and 395 (shown in phantom) of the paired semiconductor phase shift epitaxially grown layer 380 are removed by selective etching. The steps of patterning (masking and etching) are repeated for a total of at least (N−1)/2 patterning (masking and etching) steps until regions of at least N−1 of the N-paired semiconductor phase shift layers are etched. For example, as shown in FIG. 4, a mask 400 is formed and portions 405 and 410 (shown in phantom) of the paired semiconductor phase shift epitaxially grown layers 370, 375 and 380 are removed by selective etching. Then, as shown in FIG. 5, a mask 500 is formed and a portion 505 (shown in phantom) of the paired semiconductor phase shift epitaxially grown layer 365 is removed by selective etching. Finally, two more patterning steps (similar to those shown in FIGS. 1 and 2) may be performed to remove respective portions (similar to the portions 190, 195, 205 and 210 shown in FIGS. 1 and 2) from the paired semiconductor phase shift epitaxially grown layers 170, 175 and 180 by selective etching, forming 8 different effective optical cavity lengths corresponding to 8 different lasing wavelengths, but using as many as 5 patterning steps.

In many monolithic multiple wavelength vertical cavity surface-emitting laser (VCSEL) arrays, the tuning range of the individual vertical cavity surface-emitting lasers (VCSELs) in the array may be low. For example, each vertical cavity surface-emitting laser (VCSEL) in the array may be able to cover only a four-wavelength range ($\lambda_1, \lambda_2, \lambda_3, \lambda_4$, with 100 GHz spacing). To cover a range of eight wavelengths, conventionally two such vertical cavity surface-emitting lasers (VCSELs) would typically be needed in the array, one for wavelengths $\lambda_1, \lambda_2, \lambda_3, \lambda_4$, and the other for wavelengths $\lambda_5, \lambda_6, \lambda_7, \lambda_8$, for example. However, if one of these two vertical cavity surface-emitting lasers (VCSELs) in such an array fails, all of the wavelengths covered by that particular vertical cavity surface-emitting laser (VCSEL) would be missing from that array.

The present invention is directed to overcoming, or at least reducing the effects of, one or more of the problems set forth above.

SUMMARY OF THE INVENTION

In one aspect of the present invention, a device is provided, the device comprising a first vertical cavity surface-emitting laser (VCSEL) of a monolithic vertical cavity surface-emitting laser (VCSEL) array, the first vertical cavity surface-emitting laser (VCSEL) being tunable to a first plurality of wavelengths. The device also comprises a second vertical cavity surface-emitting laser (VCSEL) of the monolithic vertical cavity surface-emitting laser (VCSEL) array, the second vertical cavity surface-emitting laser (VCSEL) being tunable to a second plurality of wavelengths, wherein at least one wavelength is in both the first plurality of wavelengths and the second plurality of wavelengths.

In another aspect of the present invention, a method is provided, the method comprising forming a first of n masking layers for a device and forming a first of n phase-shift layers for the device using the first of the n masking layers. The method also comprises forming a second of n masking layers for a device, and forming a second of n phase-shift layers for the device using the second of the n masking layers and forming at least n+1 and at most $2^n$ different optical thicknesses for the device using the n masking layers and the n phase-shift layers, wherein the device comprises a first vertical cavity surface-emitting laser (VCSEL) of a monolithic vertical cavity surface-emitting laser (VCSEL) array, the first vertical cavity surface-emitting laser (VCSEL) being tunable to a first plurality of wavelengths, and a second vertical cavity surface-emitting laser (VCSEL) of the monolithic vertical cavity surface-emitting laser (VCSEL) array, the second vertical cavity surface-emitting laser (VCSEL) being tunable to a second plurality of wavelengths, wherein at least one wavelength is in both the first plurality of wavelengths and the second plurality of wavelengths.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
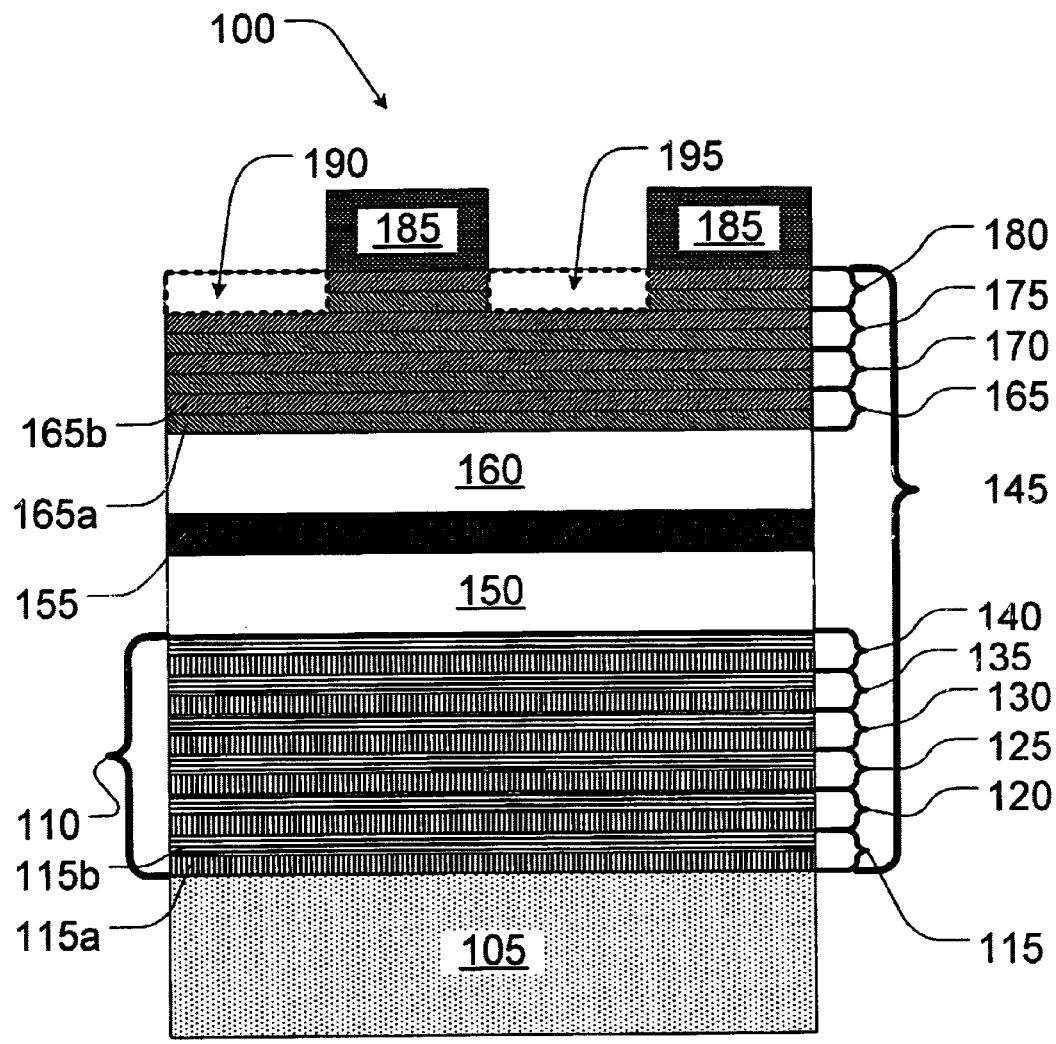
FIGS. 1–5 schematically illustrate conventional methods and devices for manufacturing monolithic multiple wavelength vertical cavity surface-emitting laser (VCSEL) arrays.
Figure 2:
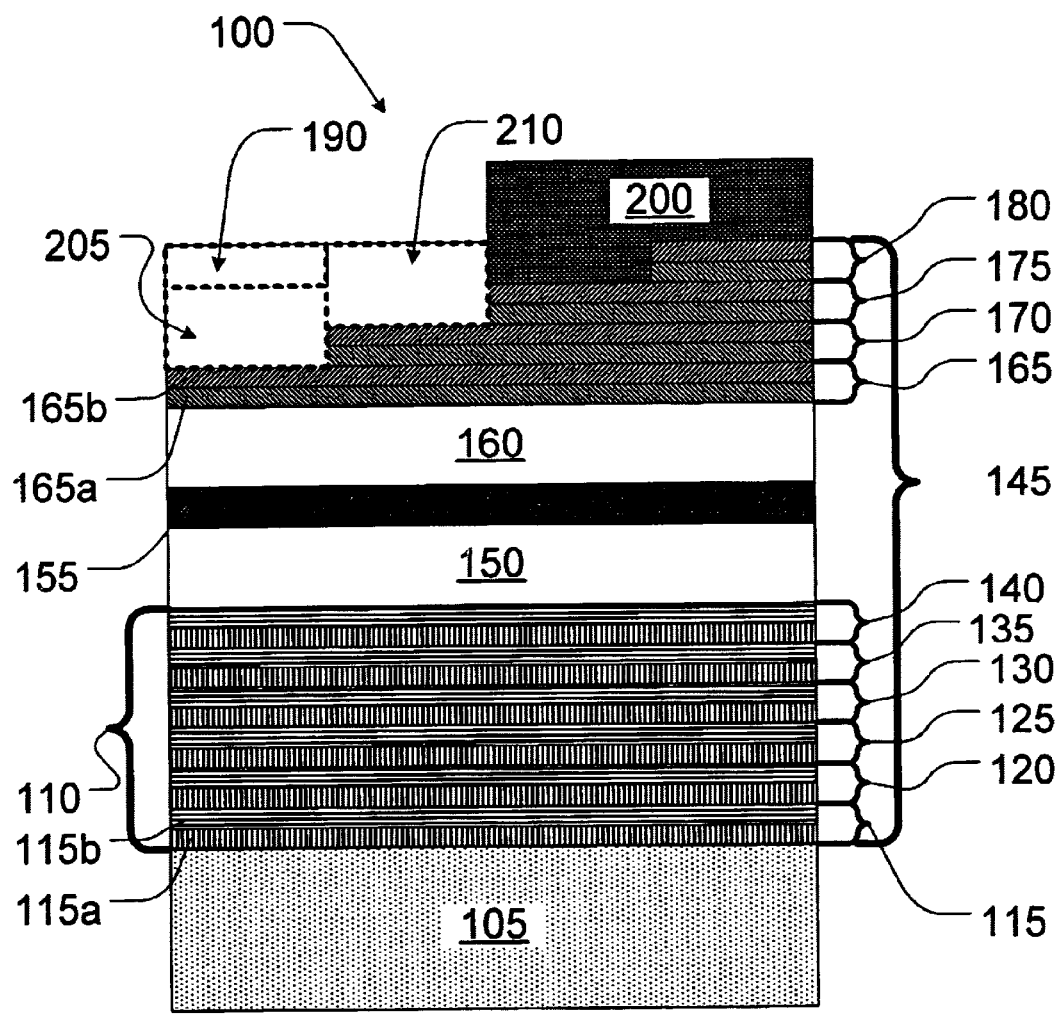
Figure 3:
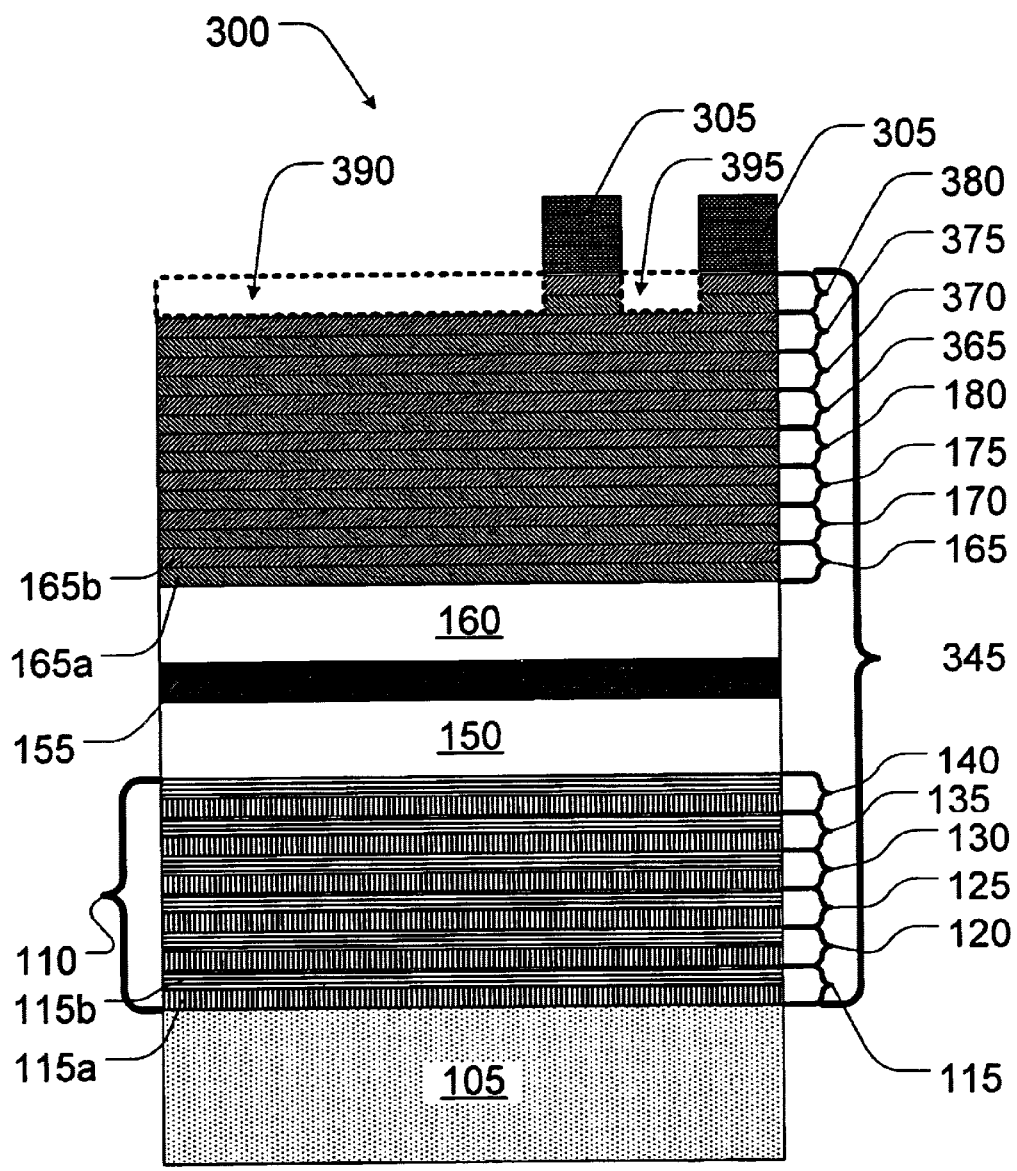
Figure 4:
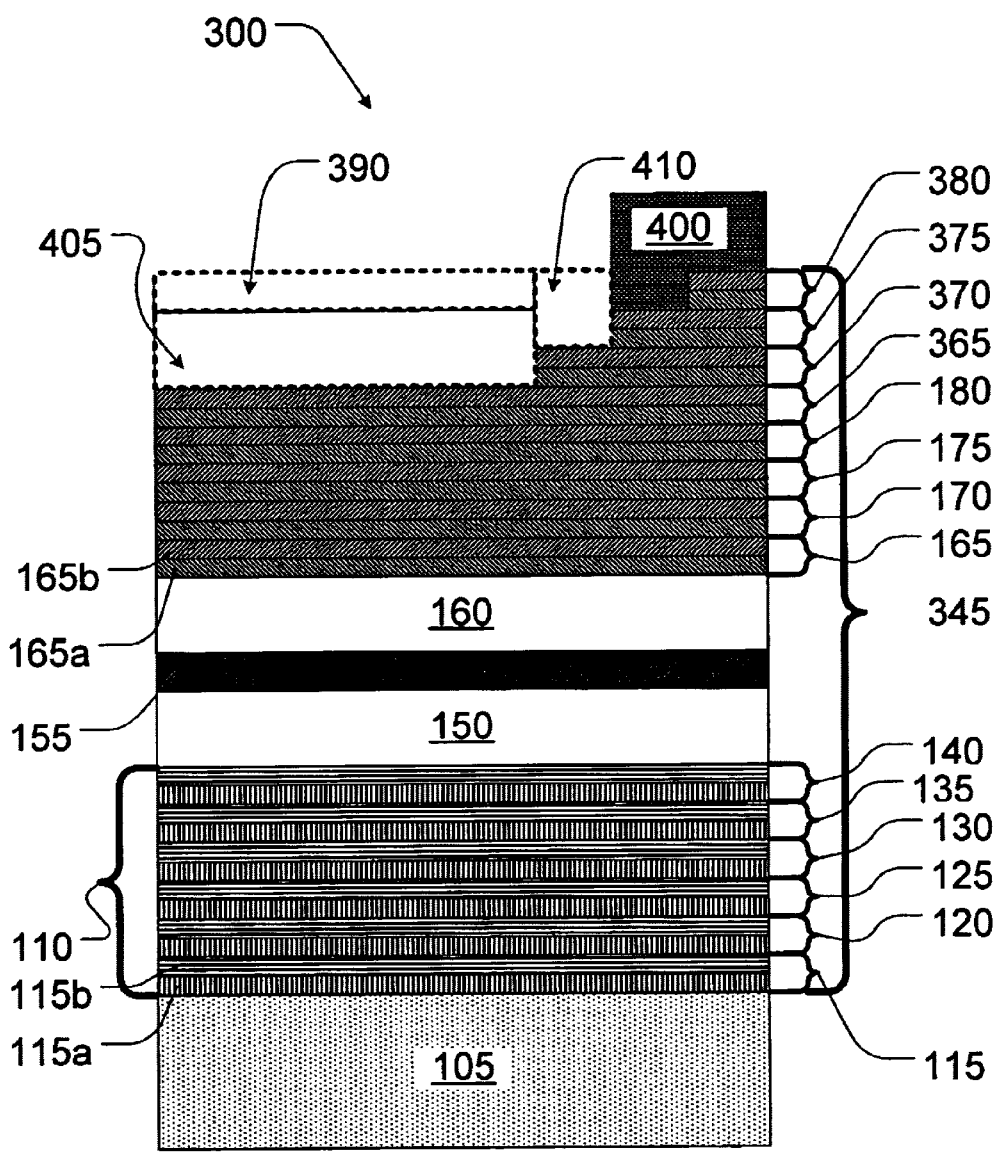
Figure 5:
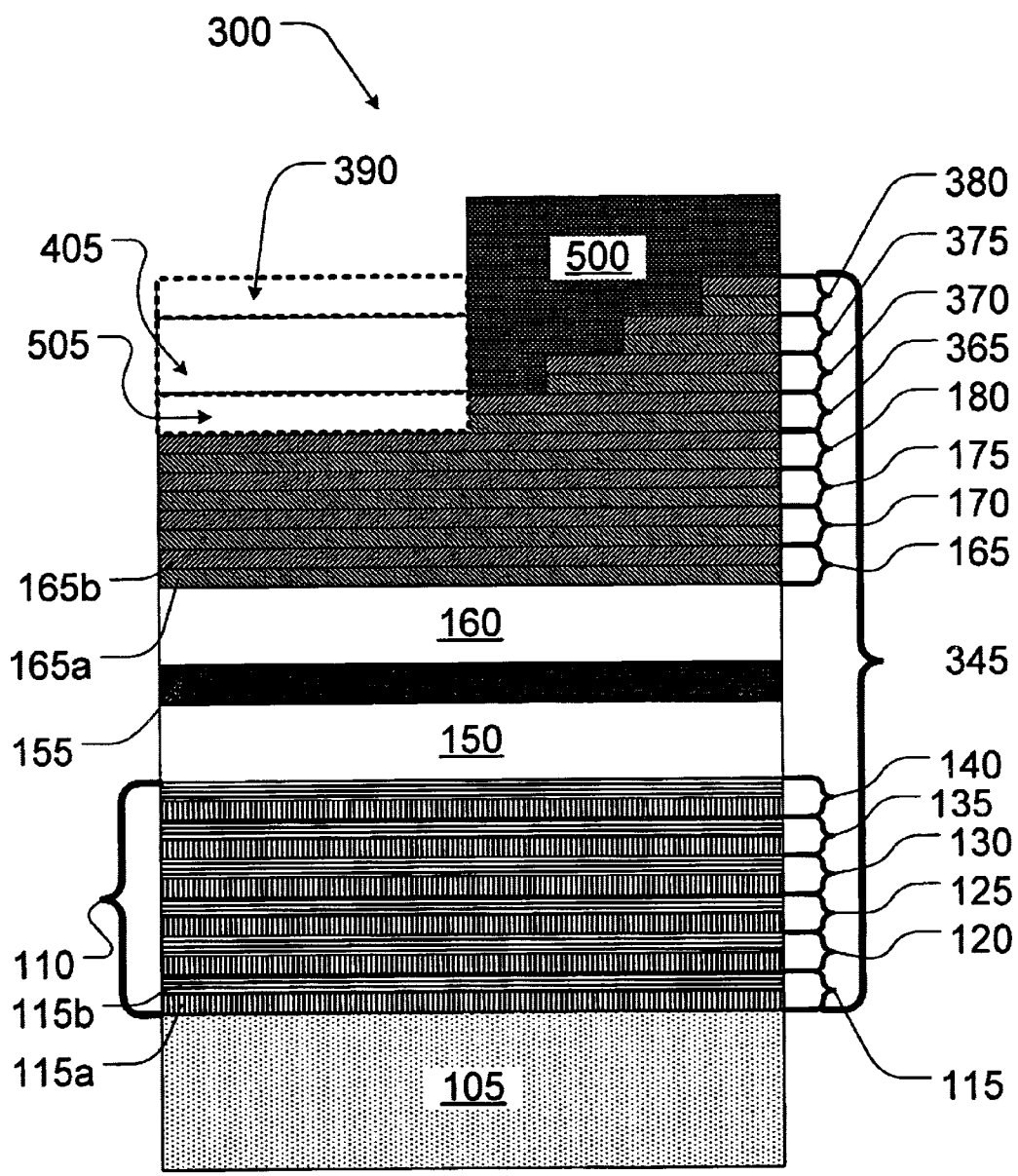

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 6:
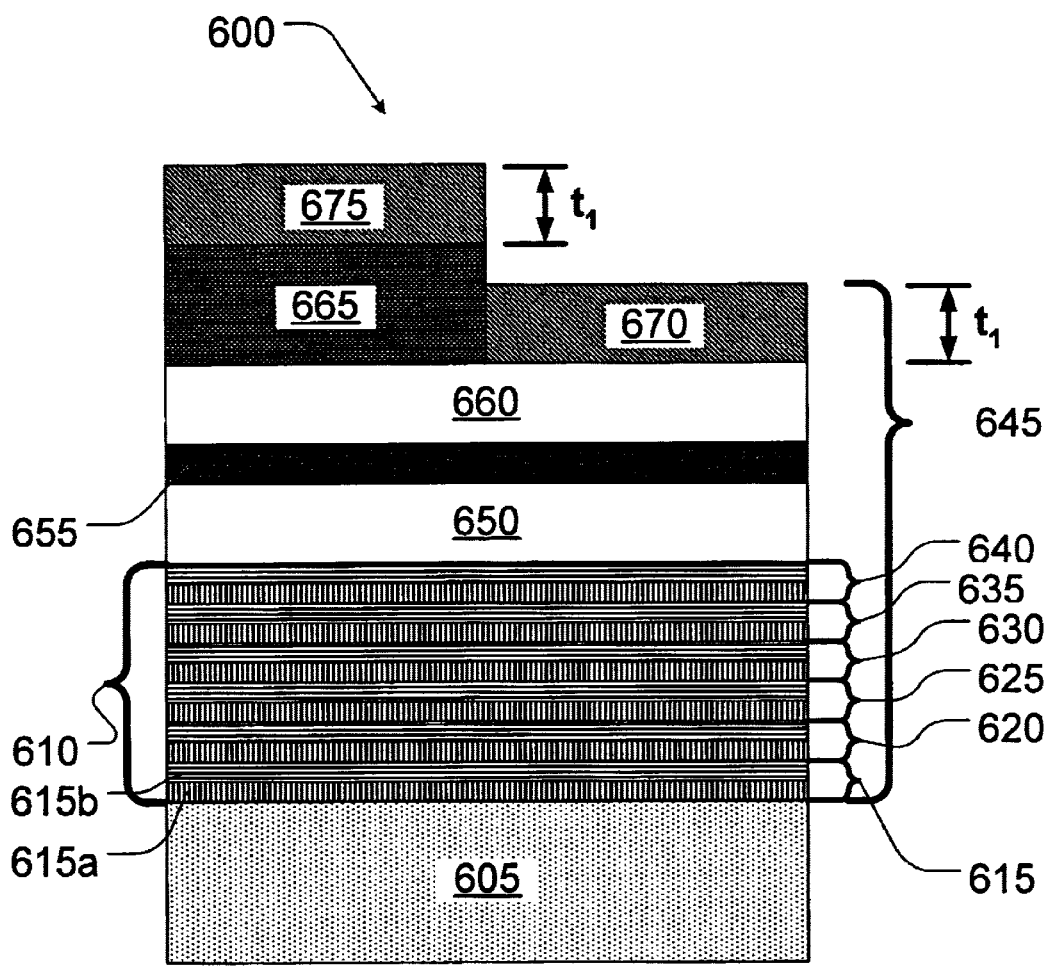
FIGS. 6–14 schematically illustrate various embodiments of a method and a device according to the present invention.

Illustrative embodiments of a method and a device according to the present invention are shown in FIGS. 6–14. As shown in FIG. 6, a vertical cavity surface-emitting laser (VCSEL) structure 600 may be grown on a substrate 605, such as a gallium arsenide (GaAs) substrate or an indium phosphide (InP) substrate. The vertical cavity surface-emitting laser (VCSEL) structure 600 may comprise a lower distributed Bragg reflector (DBR) 610 and an optical cavity 645. In various illustrative embodiments, the lower distributed Bragg reflector (DBR) 610 may be n-doped. The lower distributed Bragg reflector (DBR) 610 may comprise M pairs of layers 615, 620, 625, 630, 635 and 640 (M=6, in FIG. 6), each member of each pair having an index of refraction differing from the other member of each pair. In various illustrative embodiments, the number of pairs M may be in a range of about 4 to about 60. The lower distributed Bragg reflector (DBR) 610 may by formed, for example, on the substrate 605 by molecular beam epitaxy (MBE). For example, when the substrate 605 is gallium arsenide (GaAs), the lower member 615a of the pair 615 may comprise aluminum arsenide (AlAs) and the upper member 615b of the pair 615 may comprise aluminum gallium arsenide ($Al_xGa_{1-x}As$, where $0.15<x<1$). In various illustrative embodiments, x=0.3. In various alternative illustrative embodiments, for example, the lower distributed Bragg reflector (DBR) 610 may comprise a wide variety of suitable materials that may be chosen for various reasons including cost, reliability, manufacturability, and the like.

The optical cavity 645 includes a first intrinsic (non-doped) layer 650, formed of aluminum gallium arsenide (AlGaAs), indium gallium phosphide (InGaP), gallium arsenide (GaAs) or indium phosphide (InP), an optical gain layer 655 and a second intrinsic (non-doped) layer 660, formed of aluminum gallium arsenide (AlGaAs), indium gallium phosphide (InGaP), gallium arsenide (GaAs) or indium phosphide (InP). While the layers 650 and 660 may be intrinsic, non-doped, and/or undoped (also known as unintentionally doped), there is a trade-off between electrical conductivity and free-carrier absorption. This trade-off requires a lower relative doping in these layers 650 and 660, but for electrical pumping, these layers 650 and 660 may have to have some non-zero amount of doping.

In various illustrative embodiments, having a first intrinsic (non-doped) layer 650 lattice matched to a gallium arsenide (GaAs) substrate 605, the optical gain layer 655 may comprise about a 2200 Å layer of aluminum gallium arsenide ($Al_xGa_{1-x}As$, where x=0.3) interspersed with about 3 aluminum gallium arsenide ($Al_xGa_{1-x}As$, where x=0.12) quantum wells (QWs) or about 3 gallium arsenide (GaAs) quantum wells (QWs), suitable for wavelengths in a range of about 0.6 microns to about 1.0 microns. In various alternative illustrative embodiments, having a first intrinsic (non-doped) layer 650 lattice matched to an indium phosphide (InP) substrate 605, the optical gain layer 655 may comprise about a 2200 Å layer of indium gallium arsenide phosphide ($In_xGa_{1-x}As_yP_{1-y}$, where x is about 0.8 and y is about 0.4, for example) interspersed with about 3 indium phosphide (InP) quantum wells (QWs) or about 3 indium gallium arsenide ($In_yGa_{1-y}As$, where y=0.2) quantum wells (QWs), suitable for wavelengths in a range of up to about 1.6 microns.

The optical cavity 645 may also comprise a phase shift layer 670. The phase shift layer 670 may have a thickness $t_1$ in a range of about 10–1000 Å. The phase shift layer 670 may be formed using a lithographically patterned masking or lift-off layer 665 comprising photoresist, for example, capable of being selectively removed with respect to the phase shift layer 670. The lithographically patterned masking or lift-off layer 665 may cover a fraction of the area of the upper surface of the vertical cavity surface-emitting laser (VCSEL) structure 600. In various illustrative embodiments, for example, the lithographically patterned masking or lift-off layer 665 may cover about half the area of the upper surface of the vertical cavity surface-emitting laser (VCSEL) structure 600. In various illustrative embodiments, for example, the phase shift layer 670 comprises silicon dioxide ($SiO_2$). In various alternative illustrative embodiments, for example, the phase shift layer 670 may comprise a wide variety of suitable materials that may be chosen for various reasons including cost, reliability, manufacturability, and the like. When the phase shift layer 670 is formed, a phase shift layer 675 is also formed on the lithographically patterned masking or lift-off layer 665 comprising photoresist. When the lithographically patterned masking or lift-off layer 665 comprising photoresist is removed by being lifted off, for example, the phase shift layer 675 is also removed, leaving the phase shift layer 670 formed as a portion of the optical cavity 645 for at least a portion of the vertical cavity surface-emitting laser (VCSEL) structure 600.

Figure 7:
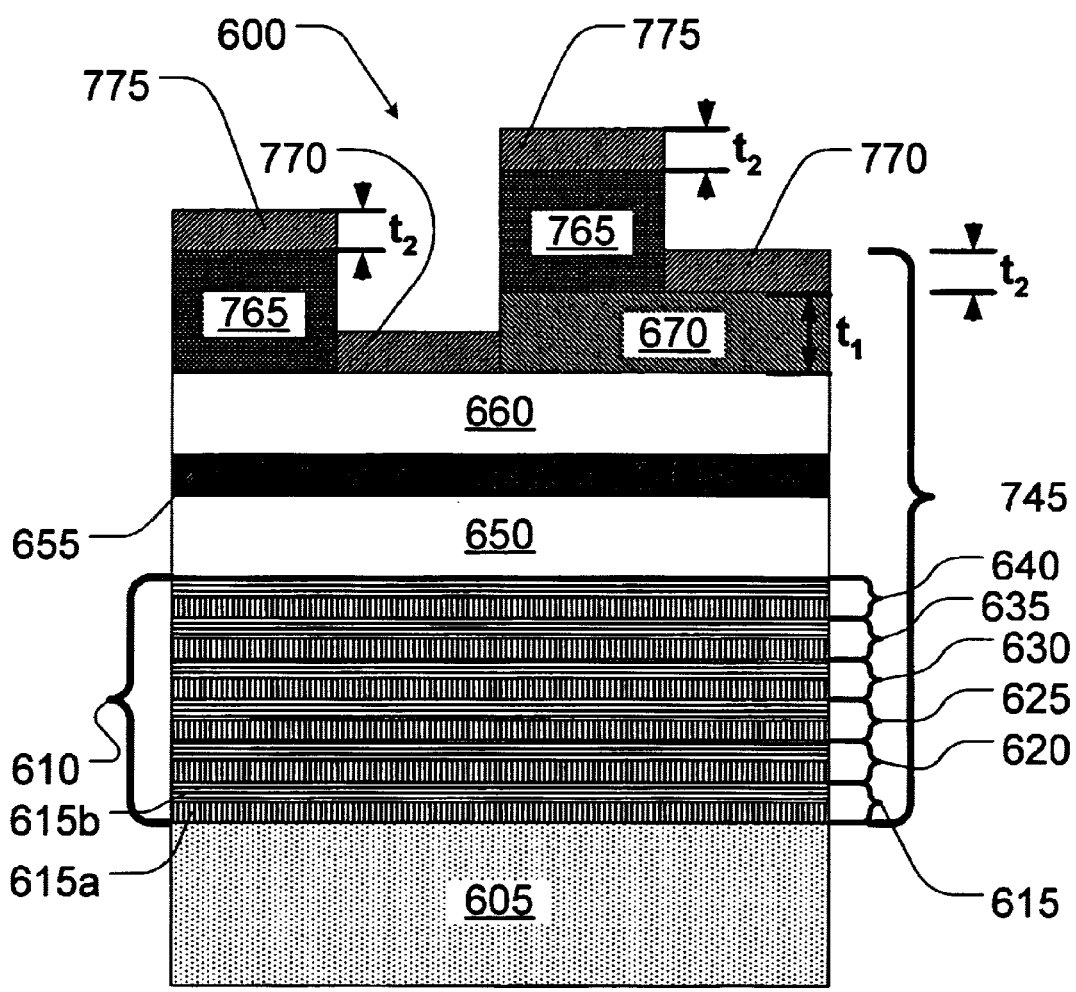

As shown in FIG. 7, an optical cavity 745 may also comprise a phase shift layer 770. The phase shift layer 770 may have a thickness $t_2$ in a range of about 10–1000 Å. The phase shift layer 770 may be formed using a lithographically patterned masking or lift-off layer 765 comprising photoresist, for example, capable of being selectively removed with respect to the phase shift layer 770. The lithographically patterned masking or lift-off layer 765 may cover about half the area of the upper surface of the vertical cavity surface-emitting laser (VCSEL) structure 600. The lithographically patterned masking or lift-off layer 765 may comprise a plurality of portions each covering about half the area of each portion of the lithographically patterned masking or lift-off layer 665.

In various illustrative embodiments, for example, the phase shift layer 770 comprises silicon dioxide ($SiO_2$). The phase shift layer 770 may comprise a plurality of portions each covering about half the area of each portion of the phase shift layer 670. When the phase shift layer 770 is formed, a phase shift layer 775 is also formed on the lithographically patterned masking or lift-off layer 765 comprising photoresist. When the lithographically patterned masking or lift-off layer 765 comprising photoresist is removed by being lifted off, for example, the phase shift layer 775 is also removed, leaving the phase shift layer 770 formed as a portion of the optical cavity 745 for at least a portion of the vertical cavity surface-emitting laser (VCSEL) structure 600.

The optical cavity 745 of the vertical cavity surface-emitting laser (VCSEL) structure 600 has 4 different effective optical cavity lengths formed, corresponding to 4 different lasing wavelengths. One effective optical cavity length includes no additional phase shift layer thickness, another effective optical cavity length includes the phase shift layer 770 having a thickness $t_2$, another effective optical cavity length includes the phase shift layer 670 having a thickness $t_1$, and another effective optical cavity length includes the phase shift layers 670 and 770 having a combined thickness $t_1+t_2$, corresponding respectively to the 4 different lasing wavelengths for 4 vertical cavity surface-emitting lasers (VCSELs) 840, 850, 860 and 870 (FIG. 8) in a monolithic array. Note that while the 4 vertical cavity surface-emitting lasers (VCSELs) 840, 850, 860 and 870 in the monolithic array illustrated in FIGS. 7 and 8 are linearly arranged, other non-linear geometries are possible, of course, as one of ordinary skill in the art having the benefit of the present disclosure would know.

Figure 8:
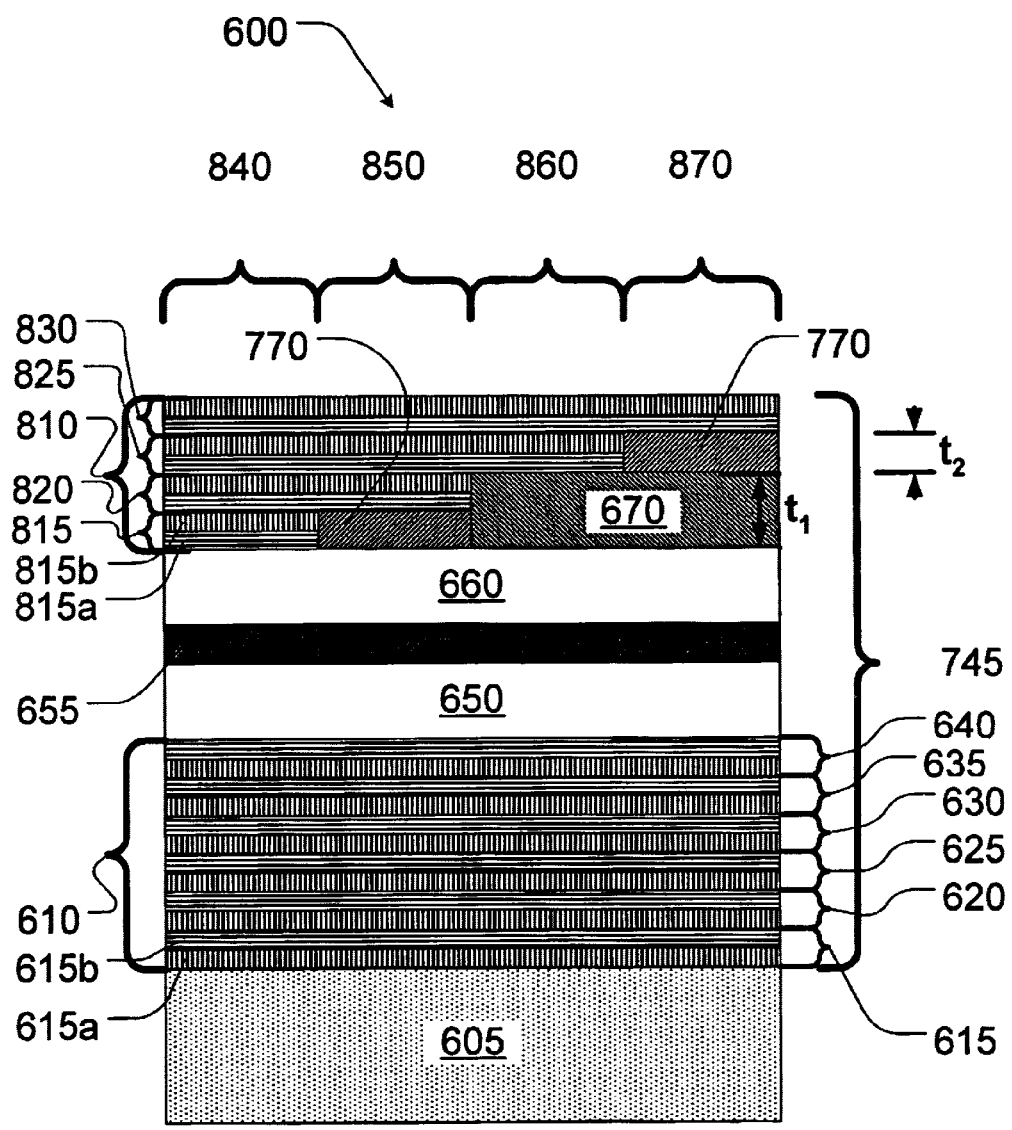

Finally, as shown in FIG. 8, an upper vertical cavity surface-emitting laser (VCSEL) structure 810 is deposited. The upper vertical cavity surface-emitting laser (VCSEL) structure 810 may include an upper distributed Bragg reflector (DBR) similar to the lower distributed Bragg reflector (DBR) 610 (FIG. 6), but typically having L pairs of layers 815, 820, 825 and 830 (L=4, in FIG. 8), each member of each pair having an index of refraction differing from the other member of each pair. In various illustrative embodiments, the number of pairs L may be in a range of about 4 to about 60. The upper distributed Bragg reflector (DBR) 810 may by formed, for example, on the optical cavity 745 by sputtering. For example, the lower member 815a of the pair 815 may comprise titanium oxide ($TiO_2$) and the upper member 815b of the pair 815 may comprise silicon oxide ($SiO_2$). Alternatively, for example, the lower member 815a of the pair 815 may comprise aluminum gallium arsenide ($Al_xGa_{1-x}As$, where $0.15<x<1$) and the upper member 815b of the pair 815 may comprise aluminum arsenide (AlAs). In various alternative illustrative embodiments, for example, the upper distributed Bragg reflector (DBR) 810 may comprise a wide variety of suitable materials that may be chosen for various reasons including cost, reliability, manufacturability, and the like.

Figure 9:
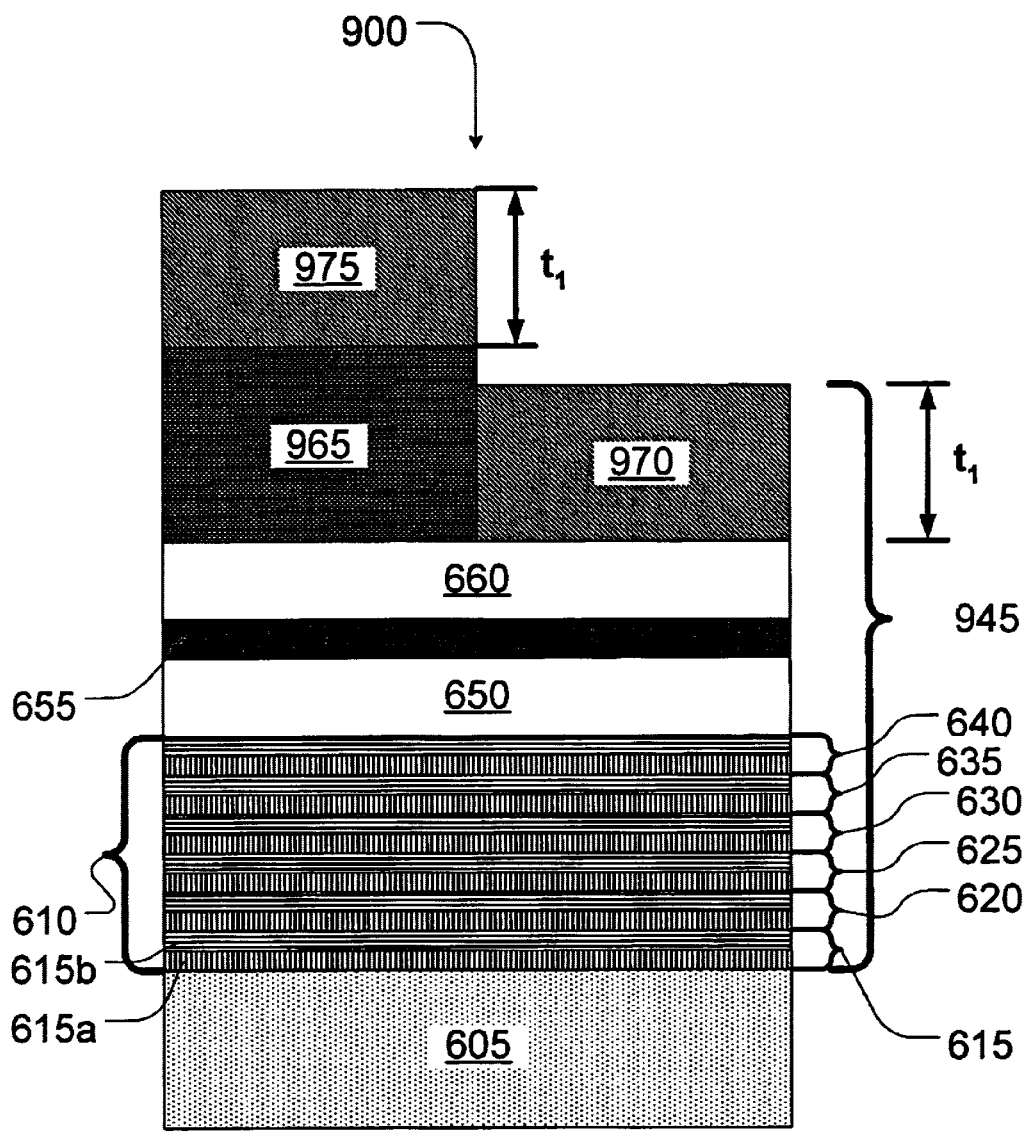

As shown in FIG. 9, a vertical cavity surface-emitting laser (VCSEL) structure 900 may be grown on a substrate 605, such as a gallium arsenide (GaAs) substrate or an indium phosphide (InP) substrate. The vertical cavity surface-emitting laser (VCSEL) structure 900 may comprise a lower distributed Bragg reflector (DBR) 610 and an optical cavity 945. In various illustrative embodiments, the lower distributed Bragg reflector (DBR) 610 may be as described above in conjunction with FIG. 6. The optical cavity 945 includes a first intrinsic (non-doped) layer 650, formed of aluminum gallium arsenide (AlGaAs), indium gallium phosphide (InGaP), gallium arsenide (GaAs) or indium phosphide (InP), an optical gain layer 655 and a second intrinsic (non-doped) layer 660, formed of aluminum gallium arsenide (AlGaAs), indium gallium phosphide (InGaP), gallium arsenide (GaAs) or indium phosphide (InP). In various illustrative embodiments, having a first intrinsic (non-doped) layer 650 lattice matched to a gallium arsenide (GaAs) substrate 605, the optical gain layer 655 may comprise about a 2200 Å layer of aluminum gallium arsenide ($Al_xGa_{1-x}As$, where x=0.3) interspersed with about 3 aluminum gallium arsenide ($Al_xGa_{1-x}As$, where x=0.12) quantum wells (QWs) or about 3 gallium arsenide (GaAs) quantum wells (QWs), suitable for wavelengths in a range of about 0.6 microns to about 1.0 microns. In various alternative illustrative embodiments, having a first intrinsic (non-doped) layer 650 lattice matched to an indium phosphide (InP) substrate 605, the optical gain layer 655 may comprise about a 2200 Å layer of indium gallium arsenide phosphide ($In_xGa_{1-x}As_yP_{1-y}$, where x is about 0.8 and y is about 0.4, for example) interspersed with about 3 indium phosphide (InP) quantum wells (QWs) or about 3 indium gallium arsenide ($In_yGa_{1-y}As$, where y=0.2) quantum wells (QWs), suitable for wavelengths in a range of up to about 1.6 microns.

The optical cavity 945 may also comprise a phase shift layer 970. The phase shift layer 970 may have a thickness $t_1$ in a range of about 10–1000 Å. The phase shift layer 970 may be formed using a lithographically patterned masking or lift-off layer 965 comprising photoresist, for example, capable of being selectively removed with respect to the phase shift layer 970. The lithographically patterned masking or lift-off layer 965 may cover a fraction, such as about an eighth or about a quarter or about half, of the area of the upper surface of the vertical cavity surface-emitting laser (VCSEL) structure 900. In various illustrative embodiments, for example, the phase shift layer 970 comprises silicon dioxide ($SiO_2$). When the phase shift layer 970 is formed, a phase shift layer 975 is also formed on the lithographically patterned masking or lift-off layer 965 comprising photoresist. When the lithographically patterned masking or lift-off layer 965 comprising photoresist is removed by being lifted off, for example, the phase shift layer 975 is also removed, leaving the phase shift layer 970 formed as a portion of the optical cavity 945 for at least a portion of the vertical cavity surface-emitting laser (VCSEL) structure 900.

Figure 10:
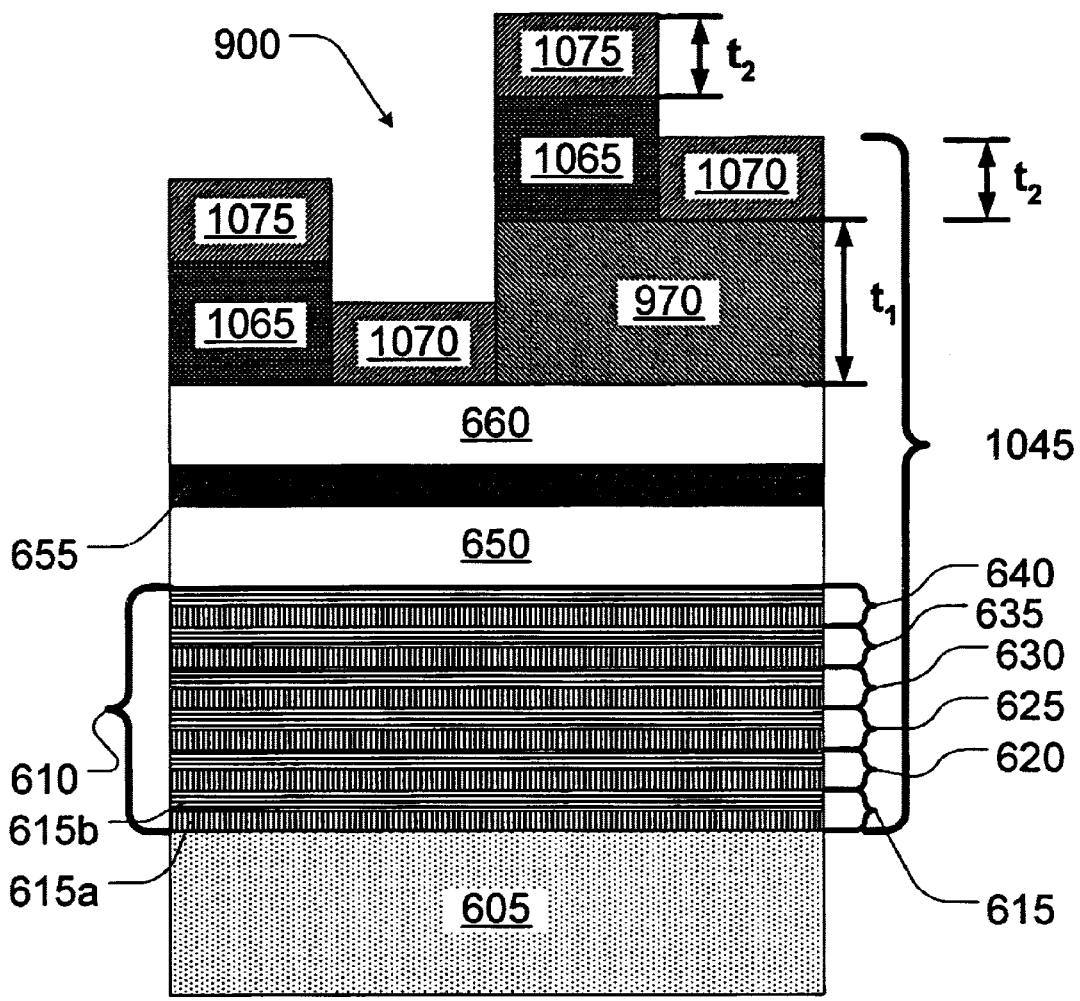

As shown in FIG. 10, an optical cavity 1045 may also comprise a phase shift layer 1070. The phase shift layer 1070 may have a thickness $t_2$ in a range of about 10–1000 Å. The phase shift layer 1070 may be formed using a lithographically patterned masking or lift-off layer 1065 comprising photoresist, for example, capable of being selectively removed with respect to the phase shift layer 1070. The lithographically patterned masking or lift-off layer 1065 may cover about half the area of the upper surface of the vertical cavity surface-emitting laser (VCSEL) structure 900. The lithographically patterned masking or lift-off layer 1065 may comprise a plurality of portions each covering about half the area of each portion of the lithographically patterned masking or lift-off layer 965.

In various illustrative embodiments, for example, the phase shift layer 1070 comprises silicon dioxide ($SiO_2$). The phase shift layer 1070 may comprise a plurality of portions each covering about half the area of each portion of the phase shift layer 970. When the phase shift layer 1070 is formed, a phase shift layer 1075 is also formed on the lithographically patterned masking or lift-off layer 1065 comprising photoresist. When the lithographically patterned masking or lift-off layer 1065 comprising photoresist is removed by being lifted off, for example, the phase shift layer 1075 is also removed, leaving the phase shift layer 1070 formed as a portion of the optical cavity 1045 for at least a portion of the vertical cavity surface-emitting laser (VCSEL) structure 900.

Figure 11:
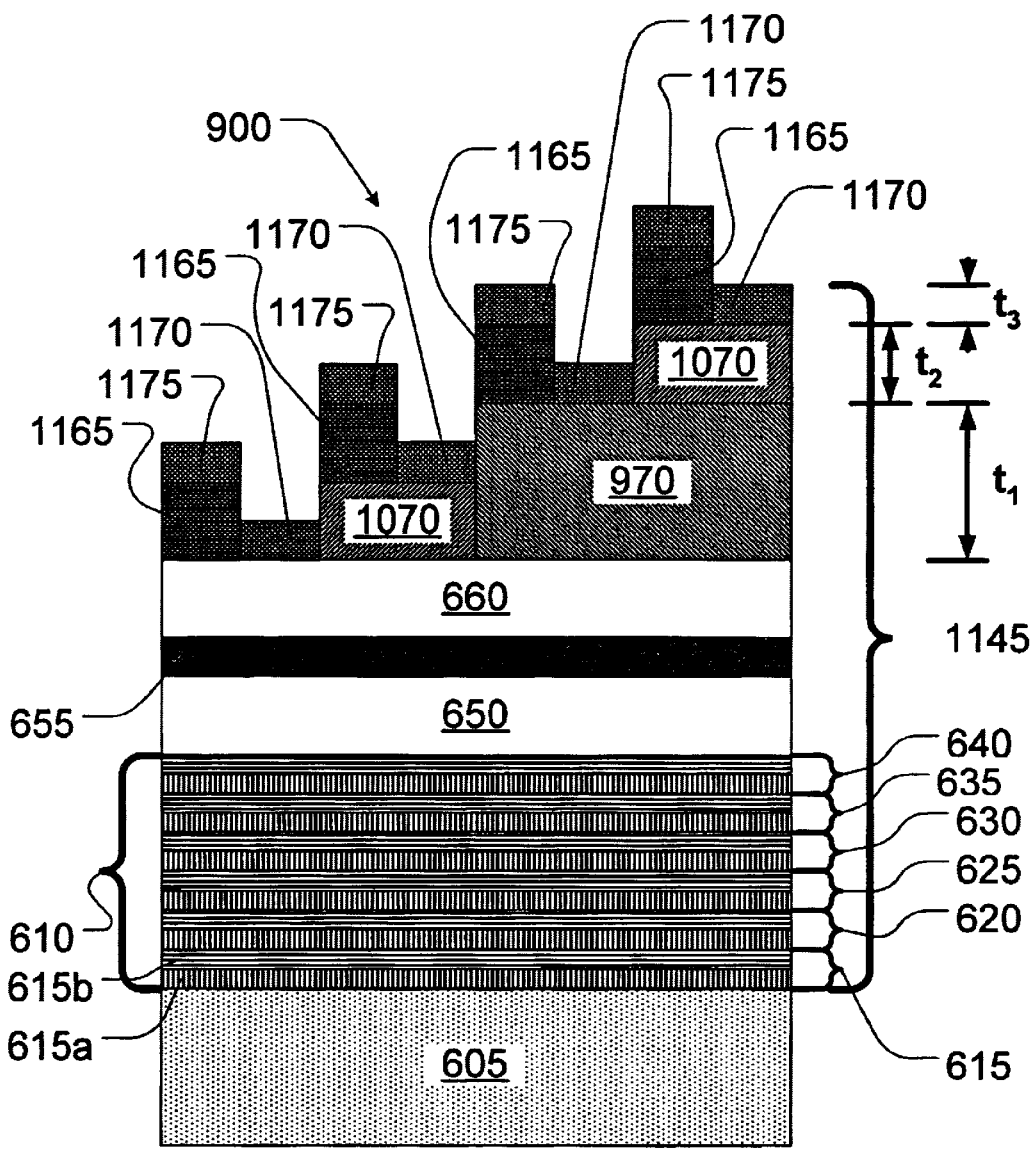

As shown in FIG. 11, an optical cavity 1145 may also comprise a phase shift layer 1170. The phase shift layer 1170 may have a thickness $t_3$ in a range of about 10–1000 Å. The phase shift layer 1170 may be formed using a lithographically patterned masking or lift-off layer 1165 comprising photoresist, for example, capable of being selectively removed with respect to the phase shift layer 1170. The lithographically patterned masking or lift-off layer 1165 may cover about half the area of the upper surface of the vertical cavity surface-emitting laser (VCSEL) structure 900. The lithographically patterned masking or lift-off layer 1165 may comprise a plurality of portions each covering about half the area of each portion of the lithographically patterned masking or lift-off layer 1065.

In various illustrative embodiments, for example, the phase shift layer 1170 comprises silicon dioxide ($SiO_2$). The phase shift layer 1170 may comprise a plurality of portions each covering about half the area of each portion of the phase shift layer 1070. When the phase shift layer 1170 is formed, a phase shift layer 1175 is also formed on the lithographically patterned masking or lift-off layer 1165 comprising photoresist. When the lithographically patterned masking or lift-off layer 1165 comprising photoresist is removed by being lifted off, for example, the phase shift layer 1175 is also removed, leaving the phase shift layer 1170 formed as a portion of the optical cavity 1145 for at least a portion of the vertical cavity surface-emitting laser (VCSEL) structure 900.

The optical cavity 1145 of the vertical cavity surface-emitting laser (VCSEL) structure 900 has 8 different effective optical cavity lengths formed, corresponding to 8 different lasing wavelengths. One effective optical cavity length includes no additional phase shift layer thickness, another effective optical cavity length includes the phase shift layer 1170 having a thickness $t_3$, another effective optical cavity length includes the phase shift layer 1070 having a thickness $t_2$, another effective optical cavity length includes the phase shift layers 1070 and 1170 having a combined thickness $t_2+t_3$, another effective optical cavity length includes the phase shift layer 970 having a thickness $t_1$, another effective optical cavity length includes the phase shift layers 970 and 1170 having a combined thickness $t_1+t_3$, another effective optical cavity length includes the phase shift layers 970 and 1070 having a combined thickness $t_1+t_2$ and another effective optical cavity length includes the phase shift layers 970, 1070 and 1170 having a combined thickness $t_1+t_2+t_3$, corresponding to the 8 different lasing wavelengths for 8 vertical cavity surface-emitting lasers (VCSELs) in a monolithic array. Note that while the 8 vertical cavity surface-emitting lasers (VCSELs) in the monolithic array illustrated in FIG. 11 are linearly arranged, other non-linear geometries are possible, of course, as one of ordinary skill in the art having the benefit of the present disclosure would know.

Finally, an upper vertical cavity surface-emitting laser (VCSEL) structure (not shown) is deposited. The upper vertical cavity surface-emitting laser (VCSEL) structure may include an upper distributed Bragg reflector (DBR) similar to the upper distributed Bragg reflector (DBR) 810, as shown in FIG. 8. The upper distributed Bragg reflector (DBR) may have fewer than the M pairs of layers of the lower distributed Bragg reflector (DBR) 610, each member of each pair having an index of refraction differing from the other member of each pair. In various illustrative embodiments, the number of pairs of layers in the upper distributed Bragg reflector (DBR) may be in a range of about 4 to about 60. The upper distributed Bragg reflector (DBR) may have fewer than M pairs of layers so that the reflectivity of the upper distributed Bragg reflector (DBR) is less than the reflectivity of the lower distributed Bragg reflector (DBR) 610. Equivalently, the transmissivity of the upper distributed Bragg reflector (DBR) is greater than the transmissivity of the lower distributed Bragg reflector (DBR) 610. Consequently, more laser photons are emitted from the upper surface of the vertical cavity surface-emitting laser (VCSEL) structure 900 than into the substrate 605.

Figure 12:
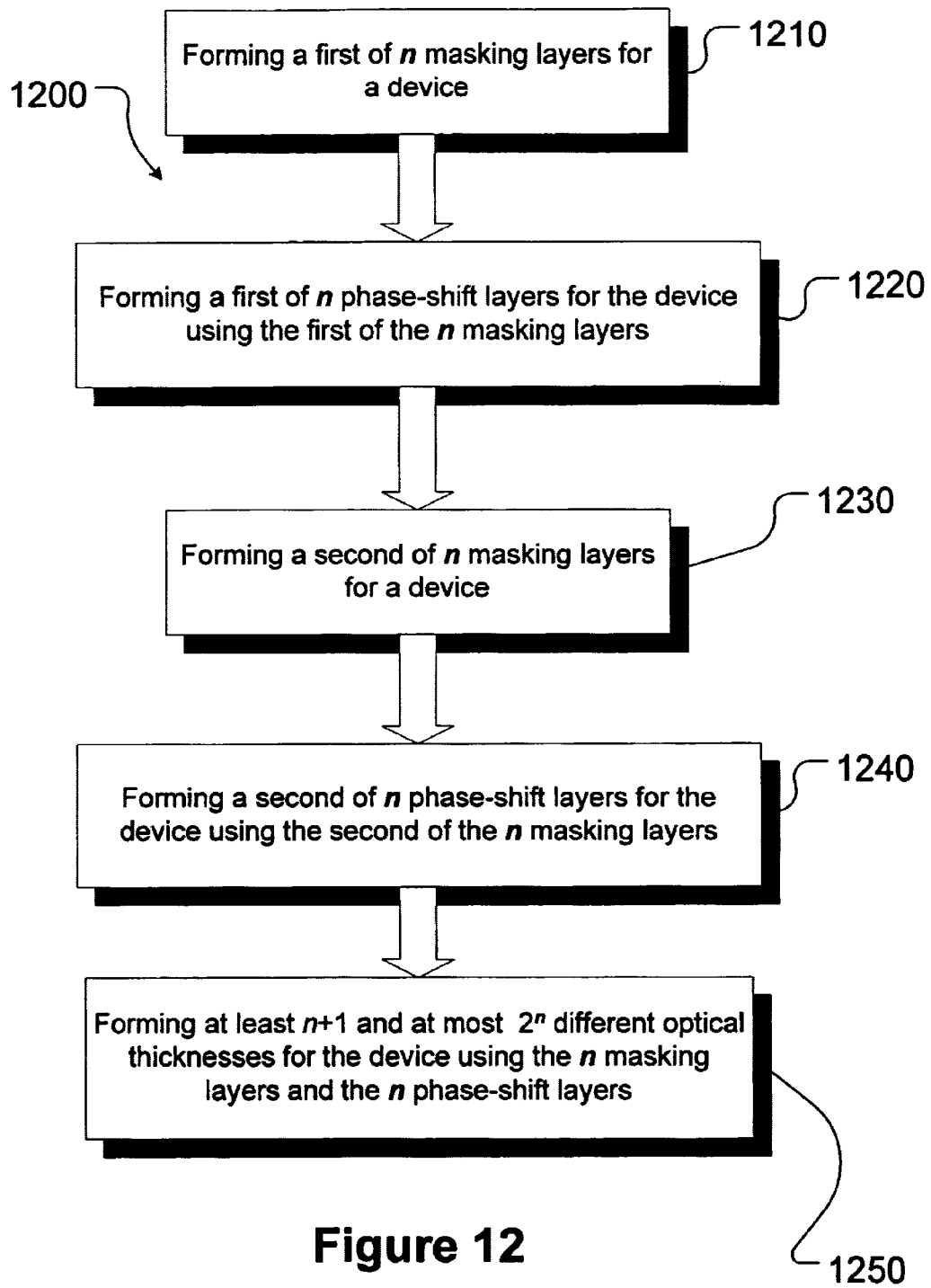
Figure 13:
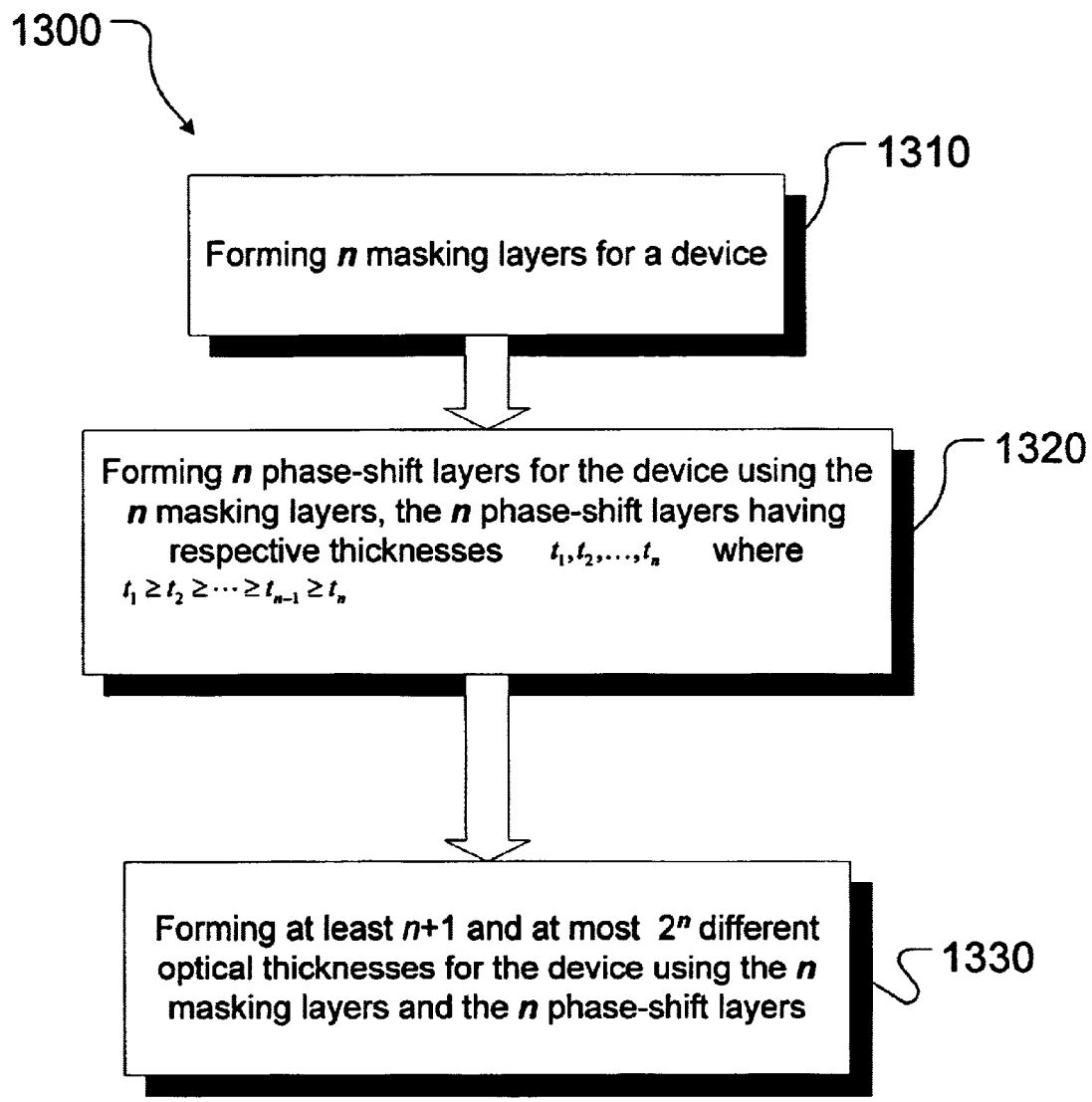
Figure 14:
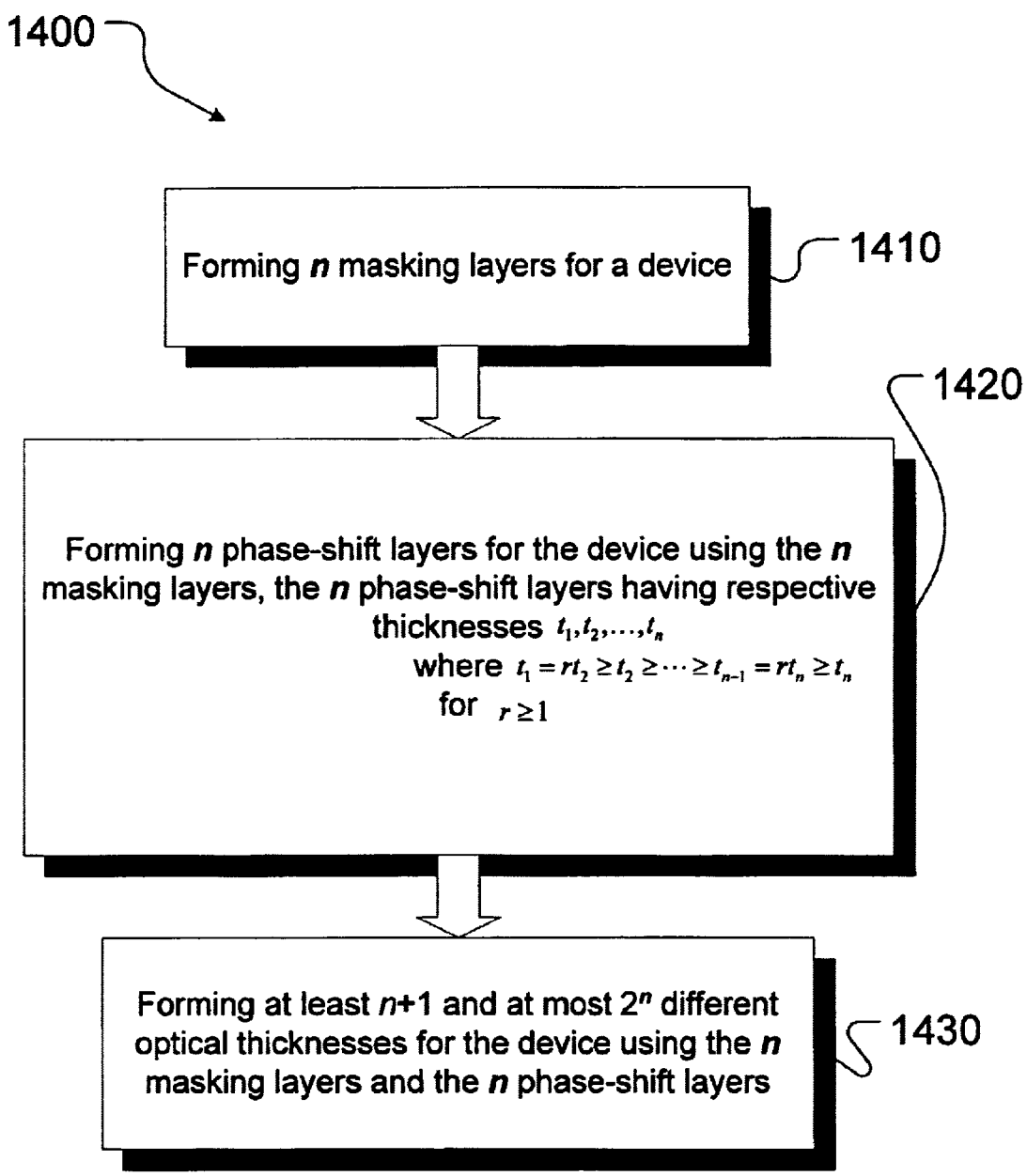

FIGS. 12–14 schematically illustrate particular embodiments of respective methods 1200–1400 practiced in accordance with the present invention. FIGS. 6–11 schematically illustrate various exemplary particular embodiments with which the methods 1200–1400 may be practiced. For the sake of clarity, and to further an understanding of the invention, the methods 1200–1400 shall be disclosed in the context of the various exemplary particular embodiments shown in FIGS. 6–11. However, the present invention is not so limited and admits wide variation, as is discussed further below.

In various illustrative embodiments, forming at least n+1 and at most $2^n$ different optical thicknesses for a device, such as a monolithic array of optical devices, using n masking layers and n phase-shift layers, may be accomplished as follows. The n phase-shift layers may have thicknesses $t_1, t_2, K, t_n$ where $t_1 \geq t_2 \geq L \geq t_{n-1} \geq t_n$. The total number $\theta$ of different optical thicknesses formed using the n phase-shift layers, having thicknesses $t_1, t_2, K, t_n$ where $t_1 = t_2 = L = t_{n-1} = t_n$ may be calculated as follows:

$$\theta = \sum_{i=0}^{i=n} i = n+1.$$

The total number θ of different optical thicknesses formed using the n phase-shift layers, having thicknesses $t_1,t_2,K,t_n$ where $t_1>t_2>L>t_{n-1}>t_n$ and $$t_i > \sum_{j=i+1}^{j=n} t_j \text{ for } i = 1, 2, K, n-2,$$

may be Calculated as Follows:

$$\theta = \sum_{i=0}^{i=n} \binom{n}{i} = \sum_{i=0}^{i=n} \frac{n!}{i!(n-i)!} = (1+1)^n = 2^n.$$

The total number θ of different optical thicknesses formed using the n phase-shift layers, having thicknesses $t_1,t_2,K,t_n$ where $t_1 \geq t_2 \geq L \geq t_{n-1} \geq t_n$, is in the range of $n+1 \leq \theta \leq 2^n$. The n phase-shift layers, having thicknesses $t_1,t_2,K,t_n$ where $t_1 \geq t_2 \geq L \geq t_{n-1} \geq t_n$, may be formed in any of n!=(n)(n−1)(n−2)L (3)(2)(1) different ways, each corresponding to one of the n! permutations of the order of forming the n phase-shift layers.

As shown in FIG. 12, the method 1200 begins, as set forth in box 1210, by forming a first of n masking layers for a device. The first of the n masking layers (similar to the lithographically patterned masking or lift-off layer 665 shown in FIG. 6 and the lithographically patterned masking or lift-off layer 965 shown in FIG. 9) may be formed above a first intrinsic (non-doped) layer/optical gain layer/second intrinsic (non-doped) layer sandwich, similar to the first intrinsic (non-doped) layer 650, optical gain layer 655 and second intrinsic (non-doped) layer 660 shown in FIGS. 6–11.

The method 1200 proceeds, as set forth in box 1220, by forming a first of n phase-shift layers for the device using the first of the n masking layers. The first of the n phase shift layers (similar to the phase shift layer 670 shown in FIG. 6 and the phase shift layer 970 shown in FIG. 9) may be formed using the lithographically patterned first of the n masking layers comprising photoresist, for example, capable of being selectively removed with respect to the first of the n phase shift layers. The lithographically patterned first of the n masking layers may cover about half the area of the upper surface of the monolithic vertical cavity surface-emitting laser (VCSEL) array.

In various illustrative embodiments, for example, the first of the n phase shift layers comprises silicon dioxide ($SiO_2$). When the first of the n phase shift layers is formed, a phase shift layer (similar to the phase shift layer 675 shown in FIG. 6 and the phase shift layer 975 shown in FIG. 9) is also formed on the lithographically patterned first of the n masking layers comprising photoresist. When the lithographically patterned first of the n masking layers comprising photoresist is removed by being lifted off, for example, the overlying phase shift layer is also removed, leaving the first of the n phase shift layers formed as a portion of the optical cavity for at least a portion of the monolithic vertical cavity surface-emitting laser (VCSEL) array.

The method 1200 proceeds, as set forth in box 1230, by forming a second of n masking layers for a device. The second of the n masking layers (similar to the lithographically patterned masking or lift-off layer 765 shown in FIG. 7 and the lithographically patterned masking or lift-off layer 1065 shown in FIG. 10) may be formed above the first intrinsic (non-doped) layer/optical gain layer/second intrinsic (non-doped) layer sandwich and the first of the n phase shift layers.

The method 1200 proceeds, as set forth in box 1240, by forming a second of n phase-shift layers for the device using the second of the n masking layers. The second of the n phase shift layers (similar to the phase shift layer 770 shown in FIG. 7 and the phase shift layer 1070 shown in FIG. 10) may be formed using the lithographically patterned second of the n masking layers comprising photoresist, for example, capable of being selectively removed with respect to the second of the n phase shift layers. The lithographically patterned second of the n masking layers may cover about half the area of the upper surface of the monolithic vertical cavity surface-emitting laser (VCSEL) array. The lithographically patterned second of the n masking layers may comprise a plurality of portions each covering about half the area of each portion of the lithographically patterned first of the n masking layers.

In various illustrative embodiments, for example, the second of the n phase shift layers comprises silicon dioxide ($SiO_2$). When the second of the n phase shift layers is formed, a phase shift layer (similar to the phase shift layer 775 shown in FIG. 7 and the phase shift layer 1075 shown in FIG. 10) is also formed on the lithographically patterned second of the n masking layers comprising photoresist. When the lithographically patterned second of the n masking layers comprising photoresist is removed by being lifted off, for example, the overlying phase shift layer is also removed, leaving the second of the n phase shift layers formed as a portion of the optical cavity for at least a portion of the monolithic vertical cavity surface-emitting laser (VCSEL) array.

The method 1200 proceeds, as set forth in box 1250, by forming at least n+1 and at most $2_n$ different optical thicknesses for the device using the n masking layers and the n phase-shift layers. In various illustrative embodiments, at least n+1 and at most $2^n$ different optical thicknesses for optical cavities for a monolithic vertical cavity surface-emitting laser (VCSEL) array using n masking layers and n phase-shift layers may be formed, as described above. The n phase-shift layers may have thicknesses $t_1,t_2,K,t_n$ where $t_1 \geq t_2 \geq L \geq t_{n-1} \geq t_n$. The total number θ of different optical thicknesses for the optical cavities of the monolithic vertical cavity surface-emitting laser (VCSEL) array formed using the n phase-shift layers, having thicknesses $t_1,t_2,K,t_n$ where $t_1=t_2=L=t_{n-1}=t_n$ may be calculated as follows:

$$\theta = \sum_{i=0}^{i=n} i = n+1.$$

The total number θ of different optical thicknesses for the optical cavities of the monolithic vertical cavity surface-emitting laser (VCSEL) array formed using the n phase-shift layers, having thicknesses $t_1,t_2,K,t_n$ where $t_1>t_2>L>t_{n-1}>t_n$ and $$t_i > \sum_{j=i+1}^{j=n} t_j$$

for i=1,2,K,n−2, may be calculated as follows:

$$\theta = \sum_{i=0}^{i=n} \binom{n}{i} = \sum_{i=0}^{i=n} \frac{n!}{i!(n-i)!} = (1+1)^n = 2^n.$$

The total number θ of different optical thicknesses for the optical cavities of the monolithic vertical cavity surface-emitting laser (VCSEL) array formed using the n phase-shift layers, having thicknesses $t_1,t_2,K,t_n$ where $t_1 \geq t_2 \geq L \geq t_{n-1} \geq t_n$ is in the range of $n+1 \leq \theta \leq 2^n$.

The total number of at least θ=n+1 and at most $\theta = 2^n$ different optical thicknesses for the optical cavities corresponds to the total number of at least θ=n+1 and at most $\theta = 2^n$ different lasing wavelengths of the monolithic vertical cavity surface-emitting laser (VCSEL) array formed using the n phase-shift layers formed by using the n masking layers, as described above. The total number $\theta = 2^n$ of different optical thicknesses for the optical cavities also corresponds to the power set (the set of all subsets) of the set of the thicknesses $t_1,t_2,K,t_n$ of the n phase-shift layers, where $t_1 > t_2 > L > t_{n-1} > t_n$ and $$t_i > \sum_{j=i+1}^{j=n} t_j$$

for i=1,2,K,n−2, the empty set corresponding to the optical thickness derived using none of the n phase-shift layers for the optical cavities.

As shown in FIG. 13, the method 1300 begins, as set forth in box 1310, by forming n masking layers for a device. The n masking layers (similar to the lithographically patterned masking or lift-off layers 665 and 765 shown in FIGS. 6 and 7, and the lithographically patterned masking or lift-off layers 965, 1065 and 1165 shown in FIGS. 9, 10 and 11) may be formed above a first intrinsic (non-doped) layer/optical gain layer/second intrinsic (non-doped) layer sandwich, similar to the first intrinsic (non-doped) layer 650, optical gain layer 655 and second intrinsic (non-doped) layer 660 shown in FIGS. 6–11.

The method 1300 proceeds, as set forth in box 1320, by forming n phase-shift layers for the device using the n masking layers, the n phase-shift layers having respective thicknesses $t_1,t_2,K,t_n$ where $t_1 \geq t_2 \geq L \geq t_{n-1} \geq t_n$. The n phase shift layers (similar to the phase shift layers 670 and 770 shown in FIGS. 6 and 7, and the phase shift layers 970, 1070 and 1170 shown in FIGS. 9, 10 and 11) may be formed using the lithographically patterned n masking layers comprising photoresist, for example, capable of being selectively removed with respect to the n phase shift layers. The lithographically patterned n masking layers may cover about half the area of the upper surface of the monolithic vertical cavity surface-emitting laser (VCSEL) array.

In various illustrative embodiments, for example, the n phase shift layers comprise silicon dioxide ($SiO_2$). When the n phase shift layers are formed, phase shift layers (similar to the phase shift layers 675 and 775 shown in FIGS. 6 and 7, and the phase shift layers 975, 1075 and 1175 shown in FIGS. 9, 10 and 11) are also formed on the lithographically patterned n masking layers comprising photoresist. When the lithographically patterned n masking layers comprising photoresist are removed by being lifted off, for example, the overlying phase shift layers are also removed, leaving the n phase shift layers formed as portions of the optical cavity for at least portions of the monolithic vertical cavity surface-emitting laser (VCSEL) array.

The method 1300 proceeds, as set forth in box 1330, by forming at least n+1 and at most $2^n$ different optical thicknesses for the device using the n masking layers and the n phase-shift layers. In various illustrative embodiments, at least n+1 and at most $2^n$ different optical thicknesses for optical cavities for a monolithic vertical cavity surface-emitting laser (VCSEL) array using n masking layers and n phase-shift layers may be formed, as described above. The n phase-shift layers may have thicknesses $t_1,t_2,K,t_n$ where $t_1 \geq t_2 \geq L \geq t_{n-1} \geq t_n$. The total number θ of different optical thicknesses for the optical cavities of the monolithic vertical cavity surface-emitting laser (VCSEL) array formed using the n phase-shift layers, having thicknesses $t_1,t_2,K,t_n$ where $t_1=t_2=L=t_{n-1}=t_n$ may be calculated as follows:

$$\theta = \sum_{i=0}^{i=n} i = n+1.$$

The total number θ of different optical thicknesses for the optical cavities of the monolithic vertical cavity surface-emitting laser (VCSEL) array formed using the n phase-shift layers, having thicknesses $t_1,t_2,K,t_n$ where $t_1 > t_2 > L > t_{n-1} t_n$ and $$t_i > \sum_{j=i+1}^{j=n} t_j$$

for i=1,2,K,n−2, may be calculated as follows:

$$\theta = \sum_{i=0}^{i=n} \binom{n}{i} = \sum_{i=0}^{i=n} \frac{n!}{i!(n-i)!} = (1+1)^n = 2^n.$$

The total number θ of different optical thicknesses for the optical cavities of the monolithic vertical cavity surface-emitting laser (VCSEL) array formed using the n phase-shift layers, having thicknesses $t_1,t_2,K,t_n$ where $t_1 \geq t_2 \geq L \geq t_{n-1} \geq t_n$ is in the range of $n+1 \leq \theta \leq 2^n$.

The total number of at least θ=n+1 and at most $\theta = 2^n$ different optical thicknesses for the optical cavities corresponds to the total number of at least θ=n+1 and at most $\theta = 2^n$ different lasing wavelengths of the monolithic vertical cavity surface-emitting laser (VCSEL) array formed using the n phase-shift layers formed by using the n masking layers, as described above. The total number $\theta = 2^n$ of different optical thicknesses for the optical cavities also corresponds to the power set (the set of all subsets) of the set of the thicknesses $t_1,t_2,K,t_n$ of the n phase-shift layers, where $t_1 > t_2 > L > t_{n-1} > t_n$ and $$t_i > \sum_{j=i+1}^{j=n} t_j$$

for i=1,2,K,n−2, the empty set corresponding to the optical thickness derived using none of the n phase-shift layers for the optical cavities.

As shown in FIG. 14, the method 1400 begins, as set forth in box 1410, by forming n masking layers for a device. The n masking layers (similar to the lithographically patterned masking or lift-off layers 665 and 765 shown in FIGS. 6 and 7, and the lithographically patterned masking or lift-off layers 965, 1065 and 1165 shown in FIGS. 9, 10 and 11) may be formed above a first intrinsic (non-doped) layer/optical gain layer/second intrinsic (non-doped) layer sandwich, similar to the first intrinsic (non-doped) layer 650, optical gain layer 655 and second intrinsic (non-doped) layer 660 shown in FIGS. 6–11.

The method 1400 proceeds, as set forth in box 1420, by forming n phase-shift layers for the device using the n masking layers, the n phase-shift layers having respective thicknesses $t_1, t_2, K, t_n$ where $t_1 = rt_2 \geq t_2 \geq L \geq t_{n-1} = rt_n \geq t_n$ for $r \geq 1$, where r may be any real number greater than or equal to one. The n phase shift layers (similar to the phase shift layers 670 and 770 shown in FIGS. 6 and 7, and the phase shift layers 970, 1070 and 1170 shown in FIGS. 9, 10 and 11) may be formed using the lithographically patterned n masking layers comprising photoresist, for example, capable of being selectively removed with respect to the n phase shift layers. The lithographically patterned n masking layers may cover about half the area of the upper surface of the monolithic vertical cavity surface-emitting laser (VCSEL) array.

In various illustrative embodiments, for example, the n phase shift layers comprise silicon dioxide ($SiO_2$). When the n phase shift layers are formed, phase shift layers (similar to the phase shift layers 675 and 775 shown in FIGS. 6 and 7, and the phase shift layers 975, 1075 and 1175 shown in FIGS. 9, 10 and 11) are also formed on the lithographically patterned n masking layers comprising photoresist. When the lithographically patterned n masking layers comprising photoresist are removed by being lifted off, for example, the overlying phase shift layers are also removed, leaving the n phase shift layers formed as portions of the optical cavity for at least portions of the monolithic vertical cavity surface-emitting laser (VCSEL) array.

The method 1400 proceeds, as set forth in box 1430, by forming at least n+1 and at most $2^n$ different optical thicknesses for the device using the n masking layers and the n phase-shift layers. In various illustrative embodiments, at least n+1 and at most $2^n$ different optical thicknesses for optical cavities for a monolithic vertical cavity surface-emitting laser (VCSEL) array using n masking layers and n phase-shift layers may be formed, as described above. The n phase-shift layers may have thicknesses $t_1, t_2, K, t_n$ where $t_1 = rt_2 \geq t_2 \geq L \geq t_{n-1} = rt_n \geq t_n$ for $r \geq 1$, where r may be any real number greater than or equal to one. The total number θ of different optical thicknesses for the optical cavities of the monolithic vertical cavity surface-emitting laser (VCSEL) array formed using the n phase-shift layers, having thicknesses $t_1, t_2, K, t_n$ where $t_1 = t_2 = L = t_{n-1} = t_n$ may be calculated as follows:

$$\theta = \sum_{i=0}^{i=n} i = n+1.$$

The total number θ of different optical thicknesses for the optical cavities of the monolithic vertical cavity surface-emitting laser (VCSEL) array formed using the n phase-shift layers, having thicknesses $t_1, t_2, K, t_n$ where $t_1 > t_2 > L > t_{n-1} > t_n$ and $$t_i > \sum_{j=i+1}^{j=n} t_j$$

for i=1,2,K,n−2, may be calculated as follows:

$$\theta = \sum_{i=0}^{i=n} \binom{n}{i} = \sum_{i=0}^{i=n} \frac{n!}{i!(n-i)!} = (1+1)^n = 2^n.$$

The total number θ of different optical thicknesses for the optical cavities of the monolithic vertical cavity surface-emitting laser (VCSEL) array formed using the n phase-shift layers, having thicknesses $t_1, t_2, K, t_n$ where $t_1 \geq t_2 \geq L \geq t_{n-1} \geq t_n$ is in the range of $n+1 \leq \theta \leq 2^n$.

The total number of at least θ=n+1 and at most θ=$2^n$ different optical thicknesses for the optical cavities corresponds to the total number of at least θ=n+1 and at most θ=$2^n$ different lasing wavelengths of the monolithic vertical cavity surface-emitting laser (VCSEL) array formed using the n phase-shift layers formed by using the n masking layers, as described above. The total number θ=$2^n$ of different optical thicknesses for the optical cavities also corresponds to the power set (the set of all subsets) of the set of the thicknesses $t_1, t_2, K, t_n$ of the n phase-shift layers, where $t_1 > t_2 > L > t_{n-1} > t_n$ and $$t_i > \sum_{j=i+1}^{j=n} t_j$$

for i=1,2,K,n−2, the empty set corresponding to the optical thickness derived using none of the n phase-shift layers for the optical cavities.

In various illustrative embodiments, the n phase-shift layers may have thicknesses $t_1, t_2, K, t_n$ where $t_1 = rt_2 > t_2 > L > t_{n-1} = rt_n > t_n$ for $r \geq 2$ and $t_i = rt_{i+1} = r^2 t_{i+2} = r^{n-i} t_n > \sum_{j=i+1}^{j=n} t_j$ for $r \geq 2$, since $\sum_{j=i+1}^{j=n} t_j = t_n \sum_{j=i+1}^{j=n} r^{n-j} = \frac{r^{n-i}-1}{r-1} t_n$, for $i = 1, 2, K, n-2$.

For example, for $r = 2$, $t_1 = 2t_2 > t_2 > L > t_{n-1} = 2t_n > t_n$ and $t_i = 2t_{i+1} = 2^2 t_{i+2} = 2^{n-i} t_n > \sum_{j=i+1}^{j=n} t_j$ since $\sum_{j=i+1}^{j=n} t_j = t_n \sum_{j=i+1}^{j=n} 2^{n-j} = \frac{2^{n-i}-1}{1} t_n = (2^{n-i}-1) t_n < 2^{n-i} t_n$, for $i = 1, 2, K, n-2$. Similarly, for $r = 3$, $t_1 = 3t_2 > t_2 > L > t_{n-1} = 3t_n > t_n$ and $t_i = 3t_{i+1} = 3^2 t_{i+2} = 3^{n-i} t_n > \sum_{j=i+1}^{j=n} t_j$ since $\sum_{j=i+1}^{j=n} t_j = t_n \sum_{j=i+1}^{j=n} 3^{n-j} = \frac{3^{n-i}-1}{2} t_n < 3^{n-i} t_n$, for $i = 1, 2, K, n-2$. Likewise, for $r = 4$, $t_1 = 4t_2 > t_2 > L > t_{n-1} = 4t_n > t_n$ and $t_1 = 4t_{i+1} = 4^2 t_{i+2} = 4^{n-i} t_n > \sum_{j=i+1}^{j=n} t_j$ since -continued $$\sum_{j=i+1}^{j=n} t_j = t_n \sum_{j=i+1}^{j=n} 4^{n-j} = \frac{4^{n-i}-1}{3} t_n < 4^{n-i} t_n, \text{ for}$$

$i = 1, 2, K, n-2$. Similarly, for $r = 5$, $$t_1 = 5t_2 > t_2 > L > t_{n-1} = 5t_n > t_n \quad \text{and}$$

$$t_1 = 5t_{i+1} = 5^2 t_{i+1} = 5^{n+1} t_n > \sum_{j=i+1}^{j=n} t_j \quad \text{since}$$

$$\sum_{j=i+1}^{j=n} t_j = t_n \sum_{j=i+1}^{j=n} 5^{n-j} = \frac{5^{n-i}-1}{4} t_n < 5^{n-i} t_n, \quad \text{for}$$

$i = 1, 2, K, n-2$. Likewise, for $r = 10$, $$t_1 = 10t_2 > t_2 > L > t_{n-1} = 10t_n > t_n \quad \text{and}$$

$$t_1 = 10t_{i+1} = 10^2 t_{i+2} = 10^{n-i} t_n > \sum_{j=i+1}^{j=n} t_j \quad \text{since}$$

$$\sum_{j=i+1}^{j=n} t_j = t_n \sum_{j=i+1}^{j=n} 10^{n-j} = \frac{10^{n-i}-1}{9} t_n < 10^{n-i} t_n, \quad \text{for}$$

$i = 1, 2, K, n-2$.

In various illustrative embodiments, the total number of at least $\theta=n+1$ and at most $\theta=2^n$ different optical thicknesses for optical cavities of a monolithic vertical cavity surface-emitting laser (VCSEL) array formed using the n phase-shift layers may correspond to the total number of at least $\theta=n+1$ and at most $\theta=2^n$ different lasing wavelengths of the monolithic vertical cavity surface-emitting laser (VCSEL) array formed using the n phase-shift layers. In various alternative illustrative embodiments, the total number of at least $\theta=n+1$ and at most $\theta=2^n$ different optical thicknesses for a monolithic array of optical filters formed using the n phase-shift layers may correspond to the total number of at least $\theta=n+1$ and at most $\theta=2^n$ different filterable wavelengths of the monolithic array of optical filters formed using the n phase-shift layers.

In various other alternative illustrative embodiments, the total number of at least $\theta=n+1$ and at most $\theta=2^n$ different optical thicknesses for a monolithic array of resonant cavity-based optical and opto-electronic devices formed using the n phase-shift layers may correspond to the total number of at least $\theta=n+1$ and at most $\theta=2^n$ different resonant modes of the monolithic array of resonant cavity-based optical and opto-electronic devices formed using the n phase-shift layers. In still other various alternative illustrative embodiments, the total number of at least $\theta=n+1$ and at most $\theta=2^n$ different optical thicknesses for a monolithic array of resonant cavity photodetectors formed using the n phase-shift layers may correspond to the total number of at least $\theta=n+1$ and at most $\theta=2^n$ different detectable resonant modes of the monolithic array of resonant cavity photodetectors formed using the n phase-shift layers.

In various alternative illustrative embodiments, forming $2^n$ different optical thicknesses for a device, such as a monolithic array of optical devices, using n masking layers and n phase-shift layers, may be accomplished as follows. The n phase-shift layers may have thicknesses $t_1,t_2,K,t_n$ where $t_1>t_2>L>t_{n-1}>t_n$ and $$t_i > \sum_{j=i+1}^{j=n} t_j$$

for i=1,2,K,n−2. The total number $\theta$ of different optical thicknesses for the monolithic array of optical devices formed using the n phase-shift layers, having thicknesses $t_1,t_2,K,t_n$ where $t_1>t_2>L>t_{n-1}>t_n$ and $$t_i > \sum_{j=i+1}^{j=n} t_j$$

for i=1,2,K,n−2, may be calculated as follows:

$$\theta = \sum_{i=0}^{i=n} \binom{n}{i} = \sum_{i=0}^{i=n} \frac{n!}{i!(n-i)!} = (1+1)^n = 2^n.$$

By contrast with the conventional Lemoff et al. '699 patent method, described above in the Description of the Related Art, which necessarily requires at least $$\left(\frac{2^n - 1}{2}\right)$$

masking steps to produce an array of $2^n$-wavelength vertical cavity surface-emitting lasers (VCSELs), methods according to various illustrative embodiments of the present invention only require n masking steps to produce an array of $2^n$-wavelength vertical cavity surface-emitting lasers (VCSELs). For a large number $2^n$ of wavelengths, whenever n is greater than 2, for example, methods according to various illustrative embodiments of the present invention are less expensive, more manageable, more practical, more efficient and have an increased yield as compared to conventional methods such as the Lemoff et al. '699 patent method.

As described above, in many monolithic multiple wavelength vertical cavity surface-emitting laser (VCSEL) arrays, the tuning range of the individual vertical cavity surface-emitting lasers (VCSELs) in the array may be low. For example, each vertical cavity surface-emitting laser (VCSEL) in an array (similar to the array 600, as shown in FIG. 8) may be able to cover only a four-wavelength range (for example, $\lambda_1,\lambda_2,\lambda_3,\lambda_4$, with spacing in a range of about 50–400 GHz; in various illustrative embodiments, the spacing may be about 100 GHz). In various illustrative embodiments, the tuning may be accomplished by controlling the temperature of the whole array of the vertical cavity surface-emitting lasers (VCSELs) and/or by controlling the electric current supplied to each vertical cavity surface-emitting laser (VCSEL) in the array. Controlling the temperature of the whole array of the vertical cavity surface-emitting lasers (VCSELs) may provide tuning over a range of about 1.5 nm, whereas controlling the electric current supplied to each vertical cavity surface-emitting laser (VCSEL) in the array may provide tuning over a range of about 2.5 nm. The tunability of the vertical cavity surface-emitting lasers (VCSELs) in the array over these ranges may be particularly useful for "C" band telecommunication applications to cover a range of about 30 nm.

In various illustrative embodiments, to cover a range R of wavelengths $\lambda_1, \lambda_2, \ldots, \lambda_R$, where R=mk=ρ; m=1,2,3, . . . ; ρ<k, about 2(m+1) vertical cavity surface-emitting lasers (VCSELs) able to cover a k-wavelength range (for example, $\lambda_1, \lambda_2, \ldots, \lambda_k$, with spacing in a range of about 50–400 GHz; in various illustrative embodiments, the spacing may be about 100 GHz) may be used in the array. In various alternative illustrative embodiments, to cover a range R of wavelengths $\lambda_1, \lambda_2, \ldots, \lambda_R$, where R=2mj; m=1,2,3, . . . , about 2m+1 vertical cavity surface-emitting lasers (VCSELs) able to cover a 2j-wavelength range (for example, $\lambda_1, \lambda_2, \ldots, \lambda_{2j}$, with spacing in a range of about 50–400 GHz; in various illustrative embodiments, the spacing may be about 100 GHz) may be used in the array, a first for wavelengths $\lambda_{-j+1}, \lambda_{-j+2}, \ldots, \lambda_{j-1}, \lambda_j$ (where $\lambda_{-j+1}, \lambda_{-j+2}, \ldots, \lambda_{-1}, \lambda_0$ are wavelengths outside the desired range R of wavelengths $\lambda_1, \lambda_2, \ldots, \lambda_R$), a second for wavelengths $\lambda_1, \lambda_2, \ldots, \lambda_{2j-1}, \lambda_{2j}$, a third for wavelengths $\lambda_{j+1}, \lambda_{j+2}, \ldots, \lambda_{3j-1}, \lambda_{3j}$, a fourth for wavelengths $\lambda_{2j+1}, \lambda_{2j+2}, \ldots, \lambda_{4j-1}, \lambda_{4j}$ and so forth until a (2m+1)-th for wavelengths $\lambda_{(2m-1)j+1}, \lambda_{(2m-1)j+2}, \ldots, \lambda_{(2m+1)j-1}, \lambda_{(2m+1)j}$ (where $\lambda_{2mj+1}, \lambda_{2mj+2}, \ldots, \lambda_{(2m+1)j-1}, \lambda_{(2m+1)j}$ are wavelengths outside the desired range R of wavelengths $\lambda_1, \lambda_2, \ldots, \lambda_R$), for example.

If any one of these (2m+1) vertical cavity surface-emitting lasers (VCSELs) in such an array fails, none of the wavelengths covered by that particular vertical cavity surface-emitting laser (VCSEL) would be missing from that array. For example, if the second vertical cavity surface-emitting laser (VCSEL) for wavelengths $\lambda_1, \lambda_2, \ldots, \lambda_{2j-1}, \lambda_{2j}$ fails, the first vertical cavity surface-emitting laser (VCSEL) for wavelengths $\lambda_{-j+1}, \lambda_{-j+2}, \ldots, \lambda_{j-1}, \lambda_j$ may be tuned to cover the wavelengths $\lambda_1, \lambda_2, \ldots, \lambda_{j-1}, \lambda_j$ and the third vertical cavity surface-emitting laser (VCSEL) for wavelengths $\lambda_{j+1}, \lambda_{j+2}, \ldots, \lambda_{3j-1}, \lambda_{3j}$ may be tuned to cover the wavelengths $\lambda_{j+1}, \lambda_{j+2}, \ldots, \lambda_{2j-1}, \lambda_{2j}$. Similarly, if the third vertical cavity surface-emitting laser (VCSEL) for wavelengths $\lambda_{j+1}, \lambda_{j+2}, \ldots, \lambda_{3j-1}, \lambda_{3j}$ fails, the second vertical cavity surface-emitting laser (VCSEL) for wavelengths $\lambda_1, \lambda_2, \ldots, \lambda_{2j-1}, \lambda_{2j}$ may be tuned to cover the wavelengths $\lambda_{j+1}, \lambda_{j+2}, \ldots, \lambda_{2j-1}, \lambda_{2j}$ and the fourth vertical cavity surface-emitting laser (VCSEL) for wavelengths $\lambda_{2j+1}, \lambda_{2j+2}, \ldots, \lambda_{4j-1}, \lambda_{4j}$ may be tuned to cover the wavelengths $\lambda_{2j+1}, \lambda_{2j+2}, \ldots, \lambda_{3j-1}, \lambda_{3j}$. Likewise, if the 2m-th vertical cavity surface-emitting laser (VCSEL) for wavelengths $\lambda_{(2m-2)j+1}, \lambda_{(2m-2)j+2}, \ldots, \lambda_{2mj-1}, \lambda_{2mj}$ fails, the (2m–1)-th vertical cavity surface-emitting laser (VCSEL) for wavelengths $\lambda_{(2m-3)j+1}, \lambda_{(2m-3)j+2}, \ldots, \lambda_{(2m-1)j-1}, \lambda_{(2m-1)j}$ may be tuned to cover the wavelengths $\lambda_{(2m-2)j+1}, \lambda_{(2m-2)j+2}, \ldots, \lambda_{(2m-1)j-1}, \lambda_{(2m-1)j}$ and the (2m+1)-th vertical cavity surface-emitting laser (VCSEL) for wavelengths $\lambda_{(2m-1)j+1}, \lambda_{(2m-1)j+2}, \ldots, \lambda_{(2m+1)j-1}, \lambda_{(2m+1)j}$ may be tuned to cover the wavelengths $\lambda_{(2m-1)j+1}, \lambda_{(2m-1)j+2}, \ldots, \lambda_{2mj-1}, \lambda_{2mj}$.

For example, in various illustrative embodiments, to cover a range of eight wavelengths $\lambda_1, \lambda_2, K, \lambda_8$, five 4-wavelength vertical cavity surface-emitting lasers (VCSELs) may be used in the array, a first for wavelengths $\lambda_{-1}, \lambda_0, \lambda_1, \lambda_2$ (where $\lambda_{-1}, \lambda_0$ are wavelengths outside the desired range of eight wavelengths $\lambda_1, \lambda_2, K, \lambda_8$), a second for wavelengths $\lambda_1, \lambda_2, \lambda_3, \lambda_4$, a third for wavelengths $\lambda_3, \lambda_4, \lambda_5, \lambda_6$, a fourth for wavelengths $\lambda_5, \lambda_6, \lambda_7, \lambda_8$ and the fifth for wavelengths $\lambda_7, \lambda_8, \lambda_9, \lambda_{10}$ (where $\lambda_9, \lambda_{10}$ are wavelengths outside the desired range of eight wavelengths $\lambda_1, \lambda_2, K, \lambda_8$), for example.

If any one of these five 4-wavelength vertical cavity surface-emitting lasers (VCSELs) in such an array fails, none of the wavelengths covered by that particular 4-wavelength vertical cavity surface-emitting laser (VCSEL) would be missing from that array. For example, if the second vertical cavity surface-emitting laser (VCSEL) for wavelengths $\lambda_1, \lambda_2, \lambda_3, \lambda_4$ fails, the first vertical cavity surface-emitting laser (VCSEL) may be tuned to cover the wavelengths $\lambda_1, \lambda_2$ and the third vertical cavity surface-emitting laser (VCSEL) may be tuned to cover the wavelengths $\lambda_3, \lambda_4$. Similarly, if the third vertical cavity surface-emitting laser (VCSEL) for wavelengths $\lambda_3, \lambda_4, \lambda_5, \lambda_6$ fails, the second vertical cavity surface-emitting laser (VCSEL) may be tuned to cover the wavelengths $\lambda_3, \lambda_4$ and the fourth vertical cavity surface-emitting laser (VCSEL) may be tuned to cover the wavelengths $\lambda_5, \lambda_6$. Likewise, if the fourth vertical cavity surface-emitting laser (VCSEL) for wavelengths $\lambda_5, \lambda_6, \lambda_7, \lambda_8$ fails, the third vertical cavity surface-emitting laser (VCSEL) may be tuned to cover the wavelengths $\lambda_5, \lambda_6$ and the fifth vertical cavity surface-emitting laser (VCSEL) may be tuned to cover the wavelengths $\lambda_7, \lambda_8$.

In various alternative illustrative embodiments, to cover a range R of wavelengths $\lambda_1, \lambda_2, \ldots, \lambda_R$, where R=2mj; m=1,2,3, . . . , about 2m vertical cavity surface-emitting lasers (VCSELs) able to cover a 2j-wavelength range (for example, $\lambda_1, \lambda_2, \ldots, \lambda_{2j}$, with spacing in a range of about 50–400 GHz; in various illustrative embodiments, the spacing may be about 100 GHz) may be used in the array, two 2j-wavelength vertical cavity surface-emitting lasers (VCSELs) for wavelengths $\lambda_1, \lambda_2, \ldots, \lambda_{2j}$, two 2j-wavelength vertical cavity surface-emitting lasers (VCSELs) for wavelengths $\lambda_{2j+1}, \lambda_{2j+2}, \ldots, \lambda_{4j-1}, \lambda_{4j}$, two 2j-wavelength vertical cavity surface-emitting lasers (VCSELs) for wavelengths $\lambda_{4j+1}, \lambda_{4j+2}, \ldots, \lambda_{6j-1}, \lambda_{6j}$, two 2j-wavelength vertical cavity surface-emitting lasers (VCSELs) for wavelengths $\lambda_{6j+1}, \lambda_{6j+2}, \ldots, \lambda_{8j-1}, \lambda_{8j}$ and so forth until two 2j-wavelength vertical cavity surface-emitting lasers (VCSELs) for wavelengths $\lambda_{(2m-1)j+1}, \lambda_{(2m-1)j+2}, \ldots, \lambda_{2mj-1}, \lambda_{2mj}$, for example.

If any one of these 2m vertical cavity surface-emitting lasers (VCSELs) in such an array fails, none of the wavelengths covered by that particular vertical cavity surface-emitting laser (VCSEL) would be missing from that array. For example, if one of the first 2j-wavelength vertical cavity surface-emitting lasers (VCSELs) for wavelengths $\lambda_1, \lambda_2, \ldots, \lambda_{2j-1}, \lambda_{2j}$ fails, the other one of the first 2j-wavelength vertical cavity surface-emitting lasers (VCSELs) for wavelengths $\lambda_1, \lambda_2, \ldots, \lambda_{2j-1}, \lambda_{2j}$ remains to cover the wavelengths $\lambda_1, \lambda_2, \ldots, \lambda_{2j-1}, \lambda_{2j}$. Similarly, if one of the second 2j-wavelength vertical cavity surface-emitting lasers (VCSELs) for wavelengths for wavelengths $\lambda_{2j+1}, \lambda_{2j+2}, \ldots, \lambda_{4j-1}, \lambda_{4j}$ fails, the other one of the second 2j-wavelength vertical cavity surface-emitting lasers (VCSELs) for wavelengths $\lambda_{2j+1}, \lambda_{2j+2}, \ldots, \lambda_{4j-1}, \lambda_{4j}$ remains to cover the wavelengths $\lambda_{2j+1}, \lambda_{2j+2}, \ldots, \lambda_{4j-1}, \lambda_{4j}$. Likewise, if one of the 2m-th 2j-wavelength vertical cavity surface-emitting lasers (VCSELs) for wavelengths $\lambda_{(2m-2)j+1}, \lambda_{(2m-2)j+2}, \ldots, \lambda_{2mj-1}, \lambda_{2mj}$ fails, other one of the 2m-th 2j-wavelength vertical cavity surface-emitting lasers (VCSELs) for wavelengths $\lambda_{(2m-2)j+1}, \lambda_{(2m-2)j+2}, \ldots, \lambda_{2mj-1}, \lambda_{2mj}$ remains to cover the wavelengths $\lambda_{(2m-2)j+1}, \lambda_{(2m-2)j+2}, \ldots, \lambda_{2mj-1}, \lambda_{2mj}$.

For example, in various illustrative embodiments, to cover a range of eight wavelengths $\lambda_1, \lambda_2, \ldots, \lambda_8$, four 4-wavelength vertical cavity surface-emitting lasers (VCSELs) may be used in the array, two 4-wavelength vertical cavity surface-emitting lasers (VCSELs) for wavelengths $\lambda_1, \lambda_2, \lambda_3, \lambda_4$ and two 4-wavelength vertical cavity surface-emitting lasers (VCSELs) for wavelengths $\lambda_5, \lambda_6, \lambda_7, \lambda_8$, for example.

If any one of these four 4-wavelength vertical cavity surface-emitting lasers (VCSELs) in such an array fails, none of the wavelengths covered by that particular 4-wavelength vertical cavity surface-emitting laser (VCSEL) would be missing from that array. For example, if the one of the vertical cavity surface-emitting lasers (VCSELs) for wavelengths $\lambda_1,\lambda_2,\lambda_3,\lambda_4$ fails, the other one of the vertical cavity surface-emitting lasers (VCSELs) for wavelengths $\lambda_1,\lambda_2,\lambda_3,\lambda_4$ remains to cover the wavelengths $\lambda_1,\lambda_2,\lambda_3,\lambda_4$. Similarly, if one of the vertical cavity surface-emitting lasers (VCSELs) for wavelengths $\lambda_5,\lambda_6,\lambda_7,\lambda_8$ fails, the other one of the vertical cavity surface-emitting lasers (VCSELs) for wavelengths $\lambda_5,\lambda_6,\lambda_7,\lambda_8$ remains to cover the wavelengths $\lambda_5,\lambda_6,\lambda_7,\lambda_8$.

In various other alternative illustrative embodiments, to cover a range R of wavelengths $\lambda_1, \lambda_2, \ldots, \lambda_R$, where $R=1,2,3,\ldots$, about 2mR; $m=1,2,3,\ldots$, vertical cavity surface-emitting lasers (VCSELs) able to cover a 1-wavelength range may be used in the array. At least 2m 1-wavelength vertical cavity surface-emitting lasers (VCSELs) may be provided for each of wavelengths $\lambda_1, \lambda_2, \ldots, \lambda_R$. If any one of the 2m 1-wavelength vertical cavity surface-emitting lasers (VCSELs) used in the array fails, the other 2m−1 of the 1-wavelength vertical cavity surface-emitting lasers (VCSELs) remain to cover that 1-wavelength range.

The burgeoning metro telecommunications network has created new challenges for service providers. Many of the illustrative embodiments described above allow the introduction of a multi-wavelength 1.55 µm VCSEL array that will enable equipment manufactures to better meet the needs of service providers. Steadily rising bandwidth demands are driving the expansion of metro networks. However, the economics of the metro network are changing. In today's metro network the price/performance balance is tilting towards lower costs and greater agility, in contrast to the performance-obsessed long-haul network.

Equipment providers have responded to this shift with new lines targeted at the emerging metro arena, but suppliers of optical components, particularly laser transmitter producers, have typically been slow to adapt. They have been unable to deliver an intermediate reach laser at an affordable price. Equipment manufactures have had to choose either expensive high-performance 1.55 µm DFB lasers or cheaper, and less advantageous, wavelengths (i.e. 1.3 µm) and laser technologies (e.g. Fabry-Perot).

The new "C" and "L" band vertical cavity surface-emitting laser (VCSEL) arrays according to many of the illustrative embodiments described above will give equipment manufacturers a new alternative for metro core and edge applications, each laser working at a different ITU wavelength with about 200 GHz spacing. This VCSEL array will help equipment suppliers meet the metro challenge by providing an economical and robust intermediate reach (2–50 km) laser.

VCSEL arrays according to many of the illustrative embodiments described above have a number of advantages. Compared to the incumbent 1.55 µm DFB edge-emitting laser technology, VCSEL arrays according to many of the illustrative embodiments described above are considerably less expensive to produce because they are grown and processed monolithically. Moreover, the ability to make cost effective, multi-wavelength arrays opens technological avenues unavailable to edge-emitting lasers. This innovation promises to significantly reduce equipment costs, giving a significant price advantage to equipment suppliers who can incorporate it into their equipment.

VCSEL arrays according to many of the illustrative embodiments described above reduce equipment costs in two ways. For example, a four-wavelength VCSEL array is less expensive than four DFB lasers. But the VCSEL arrays according to many of the illustrative embodiments described above enable a much large saving beyond simple component costs. Traditionally, each laser in a system resides on one line card, filling one slot in a telecommunications bay. A four-wavelength VCSEL according to many of the illustrative embodiments described above can eliminate the need for three of four line cards, radically expanding the capacity of a telecommunications bay. The four-VCSEL array according to many of the illustrative embodiments described above also is appropriate for applications such as multiprotocol lambda switching (MPLS), routing, optical cross-connects and switching. Higher array counts, higher power levels and/or different spacing options according to many of the illustrative embodiments described above are further advantages.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed:

1. A monolithic vertical-cavity surface-emitting laser (VCSEL) array comprising a plurality of tunable VCSELs, each tunable VCSEL having:

substantially identical gain spectrums;

a unique phase-shift layer thickness and a corresponding unique effective optical cavity length; and means for generating laser light at a selected lasing wavelength within a tuning range, for a given gain spectrum and unique effective optical cavity length, by applying a corresponding tuning condition to the VCSEL, wherein the unique effective optical cavity lengths of the VCSELs of the plurality of VCSELs are selected so that (1) under identical tuning conditions, each VCSEL of the plurality of VCSELs generates laser light at different lasting wavelengths; and (2) the tuning range of each VCSEL overlaps with the tuning range of at least one other VCSEL so that each VCSEL is capable of generating laser light at a selected lasing wavelength lying within the tuning range of the at least one other VCSEL.

2. The VCSEL array of claim 1, wherein the means for generating laser light of each tunable VCSEL comprises:

first and second reflector means defining a laser cavity therebetween; and gain means disposed between the first and second reflector means for amplifying light at wavelengths within the VCSEL's tuning range, each said tunable VCSEL being capable of generating laser light at a selected wavelength within said wavelength range.

3. The VCSEL array of claim 2, wherein:

the means for generating laser light of each tunable VCSEL further comprises an active region means disposed between the first and second reflector means for amplifying light at wavelengths within the VCSEL's tuning range, each VCSEL of the plurality of VCSELs having substantially identical active region means with substantially identical gain spectrums; and the means for generating laser light of all, or all but one, of said tunable VCSELs, further comprises a phase-shift layer disposed in the laser cavity between the active region means and the second reflector means, the phase-shift layer for each VCSEL having a unique thickness, wherein up to one VCSEL of the plurality of VCSELs may have no phase-shift layer, said one VCSEL being considered to have a zero phase-shift layer thickness.

4. The VCSEL array of claim 3, wherein the active region means of each tunable VCSEL comprises a plurality of quantum wells and the first and second reflector means of each tunable VCSEL comprise distributed Bragg reflectors (DBRs).

5. The VCSEL array of claim 1, wherein the wavelength at which the tunable VCSELs generate laser light is selected by controlling the temperature of the VCSEL array.

6. The VCSEL array of claim 1, wherein the wavelength at which the tunable VCSELs generate laser light is selected by controlling an electric current supplied to each said tunable VCSEL.

7. The VCSEL array, of claim 1, wherein each VCSEL's tuning range is broad enough to cover a plurality of wavelengths having a spacing in a range of about 50 GHz to 400 GHz, wherein the plurality of wavelengths for each tunable VCSEL partially overlaps with an adjacent plurality or wavelengths of at least one other tunable VCSEL, wherein the plurality of wavelengths for each tunable VCSEL comprises four wavelengths and adjacent pluralities of wavelengths overlap by exactly two wavelengths.

8. A monolithic vertical-cavity surface-emitting laser (VCSEL) array comprising a plurality of tunable VCSELs, each VCSEL having:

(a) a first reflector and a second reflector positioned so as to define a laser cavity therebetween; and (b) a semiconductor active region disposed between the first and second reflectors, the active region comprising a material characterized by a gain spectrum and capable of amplifying light at wavelengths within a tuning range, each VCSEL of the plurality of VCSELs having substantially identical active regions with substantially identical gain spectrums;

wherein all, or all but one, of said VCSELs, further comprise:

(c) a phase-shift layer disposed in the laser cavity between the active region and the second reflector, the phase-shift layer for each VCSEL having a unique thickness, wherein:

up to one VCSEL of the plurality of VCSELs may have no phase-shift layer, said one VCSEL being considered to have a zero phase-shift layer thickness;

each VCSEL of the plurality of VCSELs has a unique effective optical cavity length corresponding to said VCSEL's unique phase-shift layer thickness; and each VCSEL is capable of generating laser light at a selected lasing wavelength within the VCSEL's tuning range, for a given gain spectrum and unique effective optical cavity length, by applying a corresponding tuning condition to the VCSEL, wherein the unique effective optical cavity lengths of the VCSELs of the plurality of VCSELs are selected so that (1) under identical tuning conditions, each VCSEL of the plurality of VCSELs generates laser light at different lasing wavelengths; and (2) the tuning range of each VCSEL overlaps with the tuning range of at least one other VCSEL so that each VCSEL is capable of generating laser light at a selected lasing wavelength lying within the tuning range of the at least one other VCSEL.

9. The VCSEL array of claim 8, wherein the wavelength at which the tunable VCSELs generate laser light is selected by controlling the temperature of the VCSEL array.

10. The VCSEL array of claim 8, wherein the wavelength at which the tunable VCSELs generate laser light is selected by controlling an electric current supplied to each said tunable VCSEL.

11. The VCSEL array of claim 8, wherein each VCSEL's tuning range is broad enough to cover a plurality of wavelengths having a spacing in a range of about 50 GHz to 400 GHz, wherein the plurality of wavelengths for each tunable VCSEL partially overlaps with an adjacent plurality of wavelengths of at least one other tunable VCSEL.

12. The VCSEL array of claim 11, wherein the plurality of wavelengths for each tunable VCSEL have a spacing of about 100 GHz.

13. The VCSEL array of claim 11, wherein:

the plurality of wavelengths for each tunable VCSEL comprises four wavelengths and adjacent pluralities of wavelengths overlap by exactly two wavelengths.

14. The VCSEL array of claim 13, wherein the plurality of tunable VCSELs comprises about 2(m+1) VCSELs, each capable of each capable generating laser light at a selected one of a k-wavelength range and the wavelength ranges of the tunable VCSELs overlap so that the VCSEL array covers a range R of wavelengths $\lambda_1, \lambda_2, \ldots, \lambda_R$, where $R=mk+\rho$; $m=1,2,3,\ldots$; $\rho<k$, where m, k and $\rho$ are integers.

15. The VCSEL array of claim 8, wherein the active region of each tunable comprises a plurality of quantum wells.

16. The VCSEL array of claim 15, wherein the active region of each tunable VCSEL comprises about a 2200 Å layer of $Al_xGa_{1-x}As$, where x=0.3, interspersed with about 3 $Al_xGa_{1-x}As$, where x=0.12, quantum wells.

17. The VCSEL array of claim 8, wherein the first and second reflectors of each tunable VCSEL are distributed Bragg reflectors (DBRs).

18. The VCSEL array of claim 8, wherein the first reflector of each tunable VCSEL is a DBR having a plurality of $AlAs/Al_xGa_{1-x}As$ mirror pairs, where $0.15<x<1$.

19. The VCSEL array of claim 8, wherein the second reflector of each tunable VCSEL is a DBR having a plurality of $TiO_2/SiO_2$ mirror pairs.

20. The VCSEL array of claim 8, wherein the second reflector of each tunable VCSEL is a DBR having a plurality of $Al_xGa_{1-x}As/AlAs$ mirror pairs, where $0.15<x<1$.

* * * * *